(12) United States Patent
Kuo et al.

(10) Patent No.: US 11,348,816 B2
(45) Date of Patent: May 31, 2022

(54) SYSTEMS AND METHODS FOR DIE CONTAINER WAREHOUSING

(71) Applicant: Taiwan Semiconductor Manufacturing Co., Ltd., Hsinchu (TW)

(72) Inventors: Tsung-Sheng Kuo, Hsin-Chu (TW); Chih-Hung Huang, Hsin-Chu (TW); Hsueh-Lei Wang, New Taipei (TW); Yang-Ann Chu, Hsin-Chu (TW); Hsuan Lee, Tainan (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/518,250

(22) Filed: Jul. 22, 2019

(65) Prior Publication Data

US 2020/0043758 A1 Feb. 6, 2020

Related U.S. Application Data

(60) Provisional application No. 62/712,643, filed on Jul. 31, 2018.

(51) Int. Cl.
*H01L 21/677* (2006.01)
*H01L 21/673* (2006.01)
*B65G 1/137* (2006.01)

(52) U.S. Cl.
CPC ........ *H01L 21/6773* (2013.01); *B65G 1/1373* (2013.01); *H01L 21/67326* (2013.01);
(Continued)

(58) Field of Classification Search
CPC ......... H01L 21/67745; H01L 21/67333; H01L 21/67356; H01L 21/67739;
(Continued)

(56) References Cited

U.S. PATENT DOCUMENTS

| 2004/0179931 A1* | 9/2004 | Peterson | H01L 21/67386 414/798.1 |
| 2005/0036857 A1* | 2/2005 | Chen | B65G 1/0464 414/279 |

(Continued)

FOREIGN PATENT DOCUMENTS

| JP | 2015218001 A | 12/2015 |
| TW | 200933168 A | 8/2009 |
| TW | 201527774 A | 7/2015 |

*Primary Examiner* — Alia Sabur
(74) *Attorney, Agent, or Firm* — Duane Morris LLP

(57) ABSTRACT

In an embodiment, a system includes: a warehousing apparatus configured to interface with a semiconductor die processing tool configured to process a semiconductor die singulated from a wafer, wherein the semiconductor die processing tool comprise an in-port and an out-port, wherein the warehousing apparatus is configured to: move a first die vessel that contains the semiconductor die to the in-port from a first die vessel container, wherein the first die vessel container is configured to house the first die vessel; move the first die vessel from the in-port to a buffer region; and move a second die vessel from the buffer region to the out-port.

20 Claims, 22 Drawing Sheets

(52) U.S. Cl.
CPC .. *H01L 21/67333* (2013.01); *H01L 21/67706* (2013.01); *H01L 21/67724* (2013.01); *H01L 21/67745* (2013.01)

(58) Field of Classification Search
CPC ........... H01L 21/67763; H01L 21/6773; H01L 21/67326; H01L 21/67775; H01L 2221/683; H01L 21/68771; B25J 15/0019
See application file for complete search history.

(56) References Cited

U.S. PATENT DOCUMENTS

| | | | |
|---|---|---|---|
| 2006/0078415 A1* | 4/2006 | Bjork | B65D 85/38 414/802 |
| 2006/0119347 A1* | 6/2006 | Shimada | H05K 13/021 324/757.01 |
| 2008/0265408 A1 | 10/2008 | Kaufmann | |
| 2009/0035102 A1* | 2/2009 | Zimmerhackl | H01L 21/67769 414/222.04 |
| 2010/0148793 A1* | 6/2010 | Ito | G01R 31/31905 324/537 |
| 2011/0117702 A1 | 5/2011 | Rietzler | |
| 2012/0146678 A1* | 6/2012 | Lanowitz | H01L 21/67333 324/756.02 |
| 2015/0187622 A1* | 7/2015 | Johnson | H01L 21/78 438/464 |
| 2016/0111309 A1* | 4/2016 | Lill | H01L 21/67766 414/217 |
| 2016/0233120 A1 | 8/2016 | Brain | |
| 2018/0361433 A1* | 12/2018 | Bonora | B25J 15/022 |

* cited by examiner

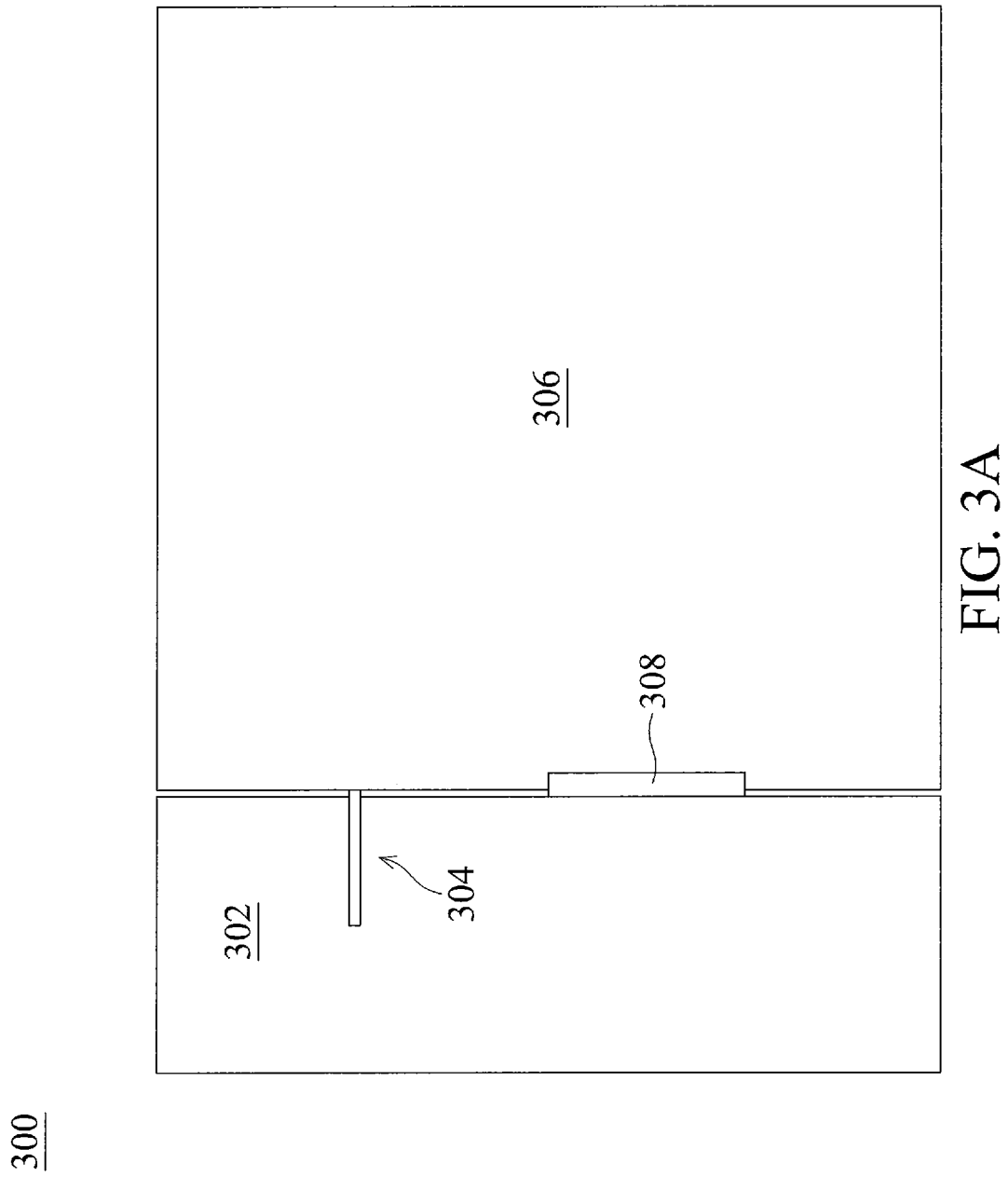

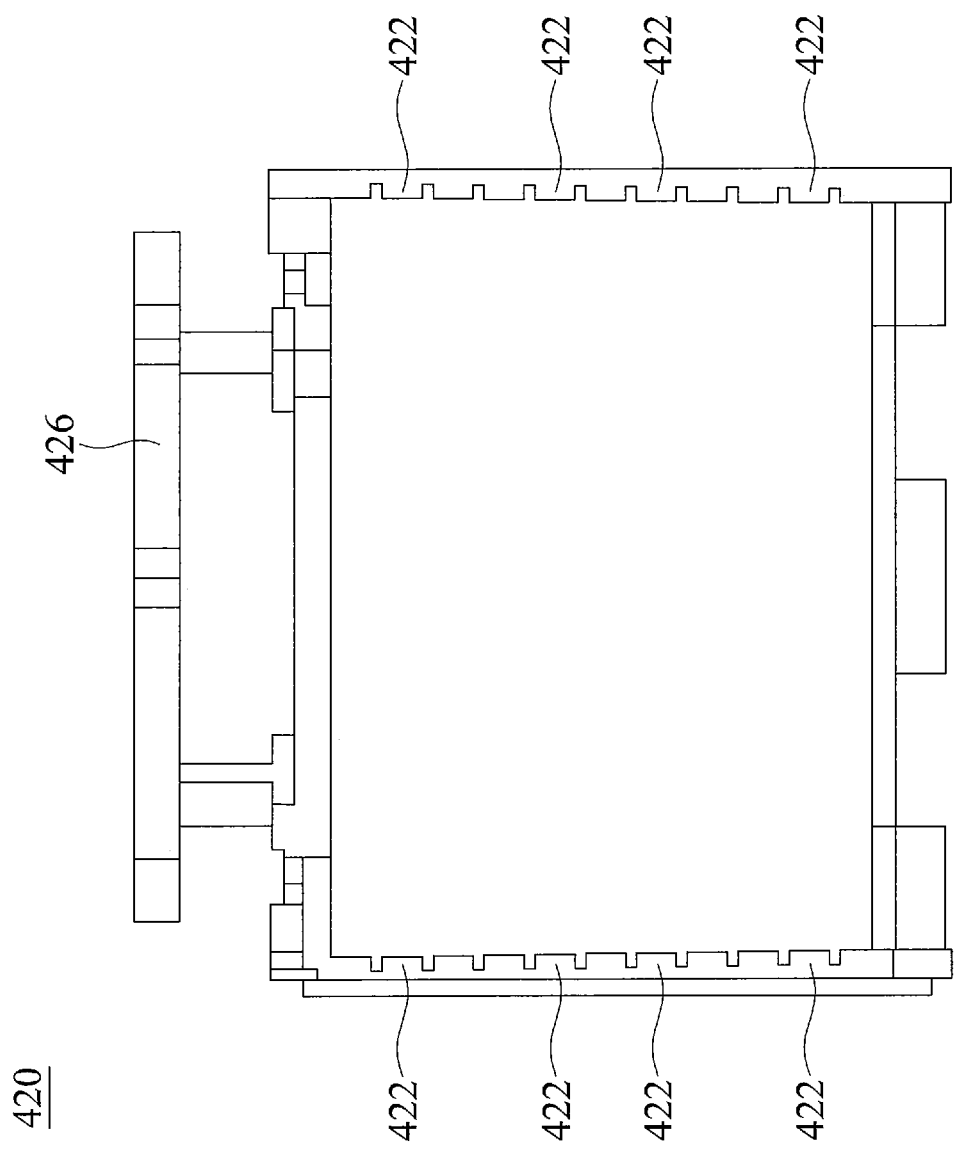

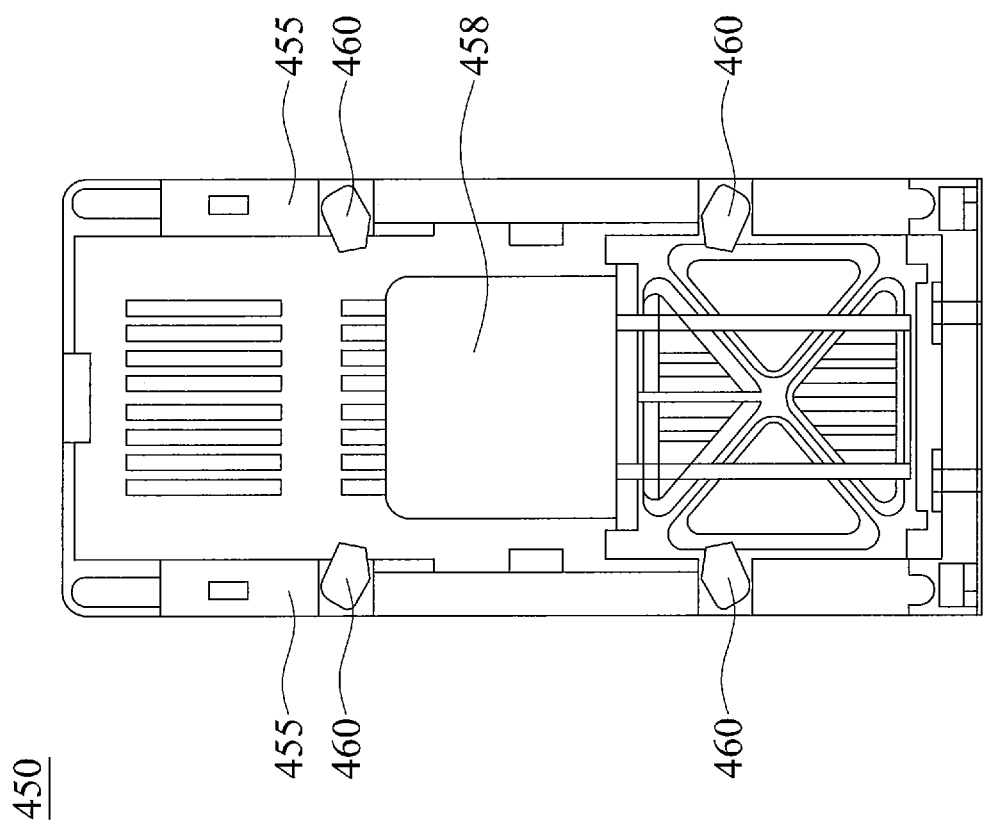

SYSTEMS AND METHODS FOR DIE CONTAINER WAREHOUSING

CROSS REFERENCE TO RELATED APPLICATIONS

This application claims priority to U.S. provisional patent application Ser. No. 62/712,643 filed on Jul. 31, 2018, which is incorporated by reference herein.

BACKGROUND

Modern manufacturing processes are typically highly automated to manipulate materials and devices and create a finished product. However, quality control and maintenance processes often rely on human skill, knowledge and expertise for inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 3A is a side view block diagram of a warehousing apparatus with a buffer region on a shelf connected to the semiconductor die processing tool, in accordance with some embodiments.

FIG. 4C is a front view diagram of the slotted die vessel container, in accordance with some embodiments.

FIG. 4F is a bottom view diagram of the stackable die vessel container, in accordance with some embodiments.

DETAILED DESCRIPTION OF EXEMPLARY EMBODIMENTS

Figure 1A:
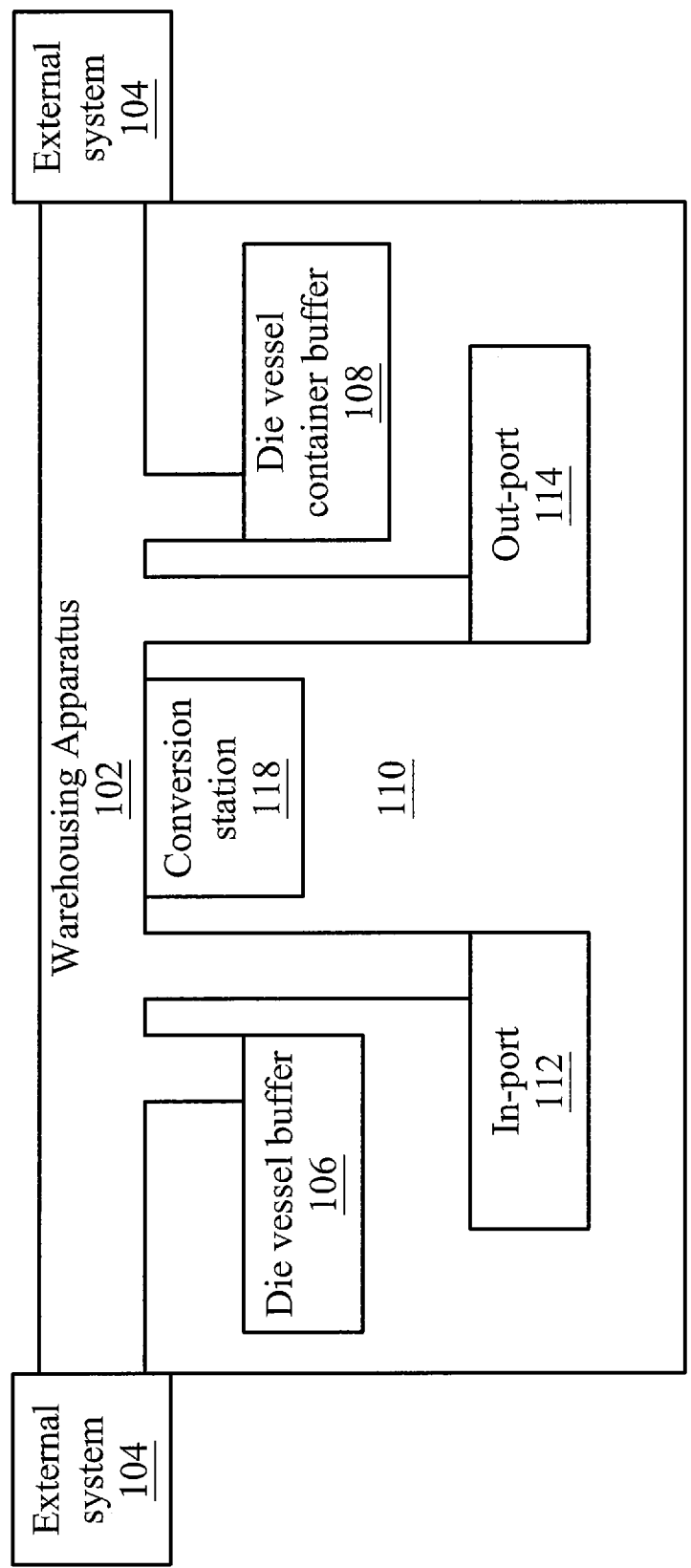
FIG. 1A is a block diagram of a warehousing apparatus, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to automated die container warehousing. This warehousing may be performed at a die vessel container warehousing apparatus that interfaces with a semiconductor die processing tool. This semiconductor die processing tool may be configured to process a semiconductor die singulated from a wafer. A die vessel may be any type of structure configured to hold one or more dies during transport to and from the semiconductor die processing tool, which may process the one or more dies of the die vessel. Accordingly, these dies may be singulated pieces of a semiconductor wafer, or semiconductor workpiece. The semiconductor die processing tool may be configured to determine whether a semiconductor die passes inspection (e.g., is properly processed), fails inspection (e.g., is improperly processed), or should be retested (e.g., is to be reprocessed). This inspection may be any type of inspection, such as an inspection for defects or for compliance with a standard. Accordingly, the semiconductor die processing tool may include an in-port and an out-port to interface with dies as facilitated by the warehousing apparatus.

In various embodiments, the warehousing apparatus may be configured to separate die vessels from die vessel containers and to move the die vessels to and from the in-port and the out-port of the semiconductor die processing tool. Furthermore, the warehousing apparatus may be configured to warehouse (e.g., store or buffer) empty die vessels whose dies have already been input into the semiconductor die processing tool. Similarly, the warehousing apparatus may also be configured to warehouse (e.g., store or buffer) empty die vessel containers whose die vessels have already been removed (e.g., separated from) the die vessel containers. These warehoused die vessel containers and die vessels may be warehoused by being stored within a buffer region of the warehousing apparatus to await a time when the empty die vessels and/or empty die vessel containers can be utilized to receive dies that have been processed by the semiconductor die processing tool. In various embodiments, these die vessel containers may be received from and transferred to a source external to the warehousing apparatus, such as an automated guided vehicle, automated material handling system, or manually from an operator of the semiconductor die processing tool. In various embodiments, the warehousing apparatus may include at least one robotic arm configured to move or manipulate the die vessels and/or die vessel containers.

The die vessel may be made of any type of material suitable for semiconductor die transport, such as a plastic or a metal. In certain embodiments, the die vessel may be referred to as a tray or a boat. Also, in particular embodiments, the die vessel may include a number of concave receptacles in which individual dies may be placed. These dies may be, optionally, further adhered in place in virtue of rotatable pin that may contact a top surface of a die while the die rests with a bottom surface on the die vessel.

The die vessel may be a discrete and removable part of a die vessel container such that the die vessel container is configured to house or contain at least one die vessel. The die vessel container may be either a slotted die vessel container or a stackable die vessel container. The slotted die vessel container may include various slots from which die vessels may be inserted or removed. When within a slotted die vessel container, the die vessels may be located at a set predetermined distance from each other, as determined by the slots in the slotted die vessel container. In contrast, die vessels may be stacked with one on top of another in a stackable die vessel container. In certain embodiments, a die vessel container may be also referred to as a magazine or a tray cassette. Also, the die vessel container may be made of either a metal or a plastic. In particular embodiments, the slotted die vessel container may be made of a metal while the stackable die vessel container may be made of a plastic. In various embodiments, a die vessel container may be associated with information procurable from a radio frequency identification (RFID) tag that is adhered to a surface of the die vessel container. Such information may include, for example, an identifier for the constituent dies within the die vessel container.

FIG. 1A is a block diagram of a warehousing apparatus 102, in accordance with some embodiments. The warehousing apparatus 102 may be interfaced with an external system 104. The external system 104 may be any system to which the warehousing apparatus may receive a die vessel container and/or provide the die vessel container to. For example, the external system 104 may be an automated material handling system (AMHS) or an automated guided vehicle (AGV) that moves die vessel containers to and/or from other warehousing apparatuses or semiconductor die processing tools within a facility.

In certain embodiments, the warehousing apparatus 102 may include a die vessel buffer 106 and a die vessel container buffer 108. Any or a combination of the die vessel buffer 106 and the die vessel container buffer 108 may be referred to also as a buffer region of the warehousing apparatus 102. Accordingly, empty die vessels and/or die vessel containers may be stored within the buffer region of the warehousing apparatus at the die vessel buffer 106 or the die vessel container buffer 108.

In various embodiments, a semiconductor die processing tool 110 may include an in-port 112 and an out-port 114. The warehousing apparatus 102 may be configured to interface with the in-port 112 and the out-port 114. For example, the warehousing apparatus 102 may be configured to receive die vessel containers from the external system 104. The die vessels of the die vessel container may be separated from the die vessel container and the empty die vessel container stored at the die vessel container buffer 108. The warehousing apparatus 102 may then bring the die vessels to the in-port so that the constituent dies of the die vessel may be processed (e.g., inspected) by the semiconductor die processing tool 110. Also, the warehousing apparatus may be configured to bring empty die vessels to the out-port to receive dies (e.g., processed dies) after processing (e.g., inspection) by the semiconductor die processing tool 110. Additionally, once sufficiently loaded with constituent dies, a full die vessel (e.g., fully loaded with constituent dies) may be combined with other die vessels (e.g., other full die vessels) at a die vessel container. This die vessel container may be retrieved from storage at the die vessel container buffer. Once the die vessel container is full, the full die vessel container may be brought out to the external system 104 for further processing.

In certain embodiments, the warehousing apparatus 102 may have a conversion station 118. The conversion station 118 may be a part of (e.g., a region of) the warehousing apparatus 102 in which die vessels are disassembled from die vessel containers or where die vessels are combined with a die vessel container (e.g., put into the die vessel container and commonly housed within the die vessel container). In certain embodiments, a die vessel container may be a slotted die vessel container. As will be discussed further below, a slotted die vessel container may include slots in which die vessels may be disposed with vertical clearance from each other (e.g., not stacked). When the die vessel container is a slotted die vessel container, a robotic arm may remove die vessels and place die vessels into the slotted die vessel container one by one in accordance with the slots within the slotted die vessel container. In other embodiments, a die vessel container may be a stackable die vessel container. As will be discussed further below, die vessels in a stackable die vessel container may be stacked one on top of another in the stackable die vessel container such that the die vessels form a die vessel stack, or a stack of die vessels. When the die vessel container is a stackable die vessel container, the conversion station 118 may include a die vessel container holding structure in which a die vessel container may be held while the die vessels are removed from the die vessel and/or while the die vessels are to be moved into the die vessel container. In certain embodiments, the conversion station 118 may also include a die vessel holding structure in which the stack of die vessels may be removed from the die vessel container in an automated manner. For example, the stackable die vessel container may be secured on the die vessel container holding structure with a bottom wall of the die vessel secured on the die vessel holding structure. The die vessel container holding structure and/or the die vessel holding structure may remove holding pins from securing a bottom wall of the die vessel container (e.g., by rotating the holding pins away from a position in which they secure the bottom wall of the die vessel container). Then the die vessel holding structure may be moved away from the die vessel container holding structure, removing the die vessels (e.g., the stack of die vessels) from the die vessel container. For example, the die vessel holding structure may be moved away from the die vessel container holding structure by vertical displacement (e.g., lowering the stack of die vessels relative to the die vessel container or raising the die vessel container relative to the stack of die vessels) and then lateral displacement (e.g., by laterally moving the die vessel container relative to the stack of die vessels or laterally moving the die vessel container relative to the stack of die vessels).

In particular embodiments, a die vessel stack robotic arm may be a specialized robotic arm with an end effector configured to move die vessel stacks. The die vessel stack robotic arm end effector may include a lower surface configured to slide under the bottom wall of the die vessel container and/or the lowest die vessel of the stack of die vessels to move the stack of die vessels. The die vessel stack robotic arm end effector may also include side gates configured to laterally support the stack of die vessels so that individual die vessels do not slide off of the stack of dies while in transit. The die vessel stack robotic arm end effector may include an open front opposite to a rear portion which interfaces with the rest of the die vessel stack robotic arm. For example, the stack of die vessels may be moved to and/or from any of a die vessel buffer 106, in-port 112, out-port 114, or any other part of the warehousing apparatus 102 using this die vessel stack robotic arm end effector. Furthermore, although a specific type of end effector and a specific type of robotic arm is discussed above, any type of end effector and any type of robotic arm may be utilized in the warehousing apparatus 102 as desired for different applications in various embodiments. For example, a specialized robotic arm may be utilized for slotted die vessel containers (e.g., different than the die vessel stack robotic arm) to individually manipulate die vessels not arranged in a stack. Furthermore, other types of end effectors may be utilized in a robotic arm of the warehousing apparatus for grasping or holding an object and manipulating the object within a work envelope of the robotic arm, such as a pressure gripper (e.g., gripping by applying pressure to an object, such as with a pincer type motion), an area gripper (e.g., gripping by surrounding an object to be manipulated), a vacuum gripper (e.g., gripping by suction force), and a magnetic gripper (e.g., gripping by use of electromagnetic forces), and the like. In certain embodiments, the end effector may be a gripper hand with at least two fingers, with one opposing the other. The multiple fingers may be utilized to apply pressure as a pressure gripper and or as an area gripper.

Figure 1B:
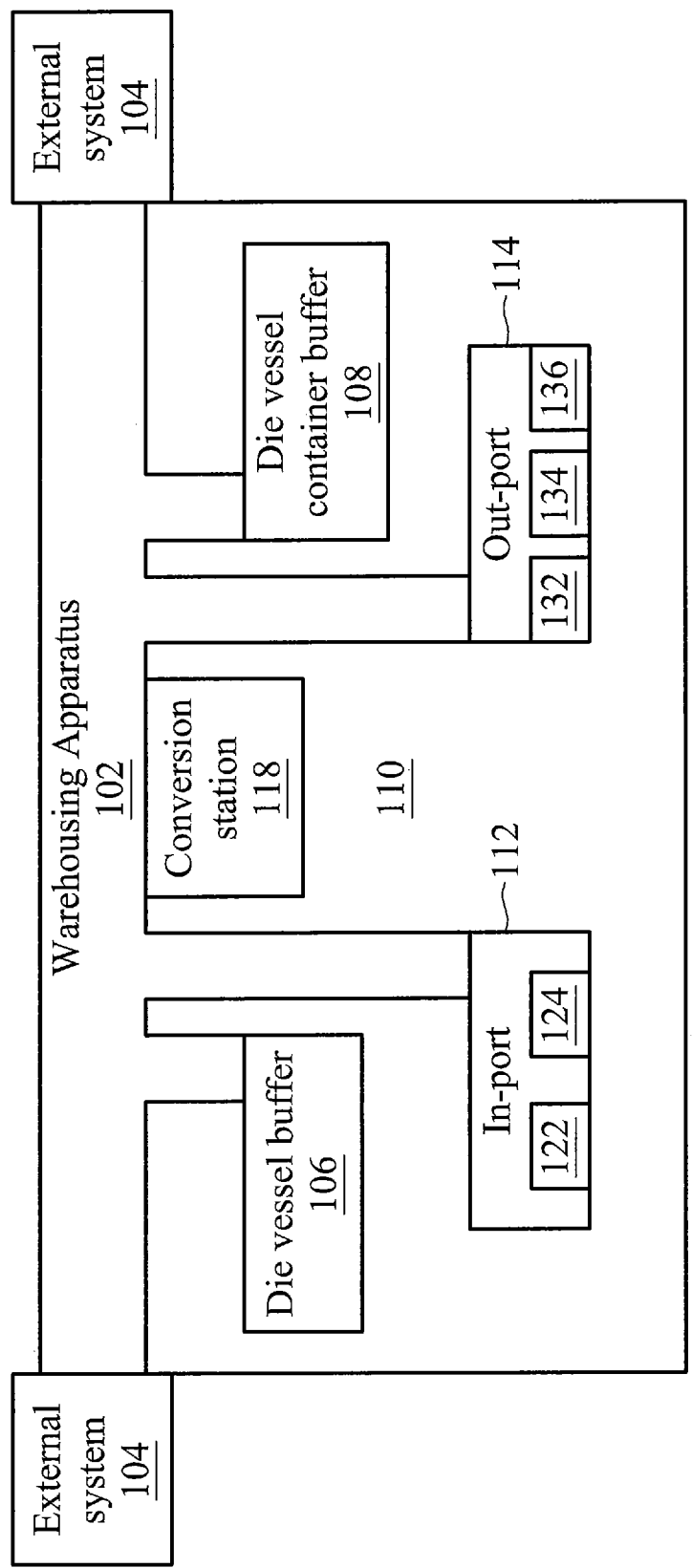
FIG. 1B is a block diagram of the warehousing apparatus with sub-ports, in accordance with some embodiments.

FIG. 1B is a block diagram of the warehousing apparatus 102 with sub-ports, in accordance with some embodiments. These sub-ports may be discrete parts of the in-port 112 and/or the out-port 114. For example, the in-port 112 may have a loaded die vessel in-port 122 and an empty die vessel in-port 124. The loaded die vessel in-port 122 may be an in-port to the semiconductor die processing tool 110 in which a die vessel with dies that are to be processed by the semiconductor die processing tool 110 may be received by the semiconductor die processing tool 110. The entire die vessel may be ingested by the semiconductor die processing tool 110 with the individual constituent dies of the die vessel taken by the semiconductor die processing tool 110 for processing. Then, after the individual constituent dies of the die vessel are taken by the semiconductor die processing tool 110 for processing, the empty die vessel may be provided at the empty die vessel in-port 124. Stated another way, the empty die vessel is returned or surrendered from the semiconductor die processing tool at the empty die vessel in-port. The warehousing apparatus 102 may take the empty die vessel from the empty die vessel in-port 124 for storage at the die vessel buffer 106.

In certain embodiments, the out-port 114 may have, as sub-ports, a pass out-port 132, a fail out-port 134, and a reprocess out-port 136. The pass out-port 132 may be a location at the semiconductor die processing tool 110 in which processed semiconductor dies (e.g., inspected semiconductor dies) that meet or exceed a processing standard (e.g., that are without defects or that are without detected defects by the semiconductor die processing tool 110) may be deposited on a die vessel. As noted above, in particular embodiments processing may refer to an inspection of semiconductor dies. In certain embodiments, the pass out-port may require a die vessel to receive the individually processed semiconductor dies that meet or exceed the processing standard. Thus, an empty die vessel may be brought by the warehousing apparatus 102 to the pass out-port 132 to receive the processed semiconductor dies at the pass out-port 132. Stated another way, the die vessel at the pass out-port 132 may be loaded with semiconductor dies at the pass out-port. This empty die vessel may be brought from the die vessel buffer 106 to the pass out-port 132 to receive the semiconductor dies processed by the semiconductor die processing tool 110. Once fully loaded, the die vessel may be inserted (e.g., combined or loaded) into a die vessel container. In certain embodiments, the fully loaded die vessel may be loaded along with other fully loaded die vessels into the die vessel container (e.g., as a stack of die vessels). In certain embodiments, the die vessel container may be brought from the die vessel container buffer 108 to the conversion station 118. At the conversion station 118, the die vessel container may receive (e.g., be combined with) at least one fully loaded die vessel from the pass out-port 132. Then, once the die vessel container is fully loaded with die vessels from the pass out-port 132, the fully loaded die vessel container may be transported by the warehousing apparatus 102 to the external system 104 for further processing.

In certain embodiments, the fail out-port 134 may be a location at the semiconductor die processing tool 110 in which processed semiconductor dies (e.g., inspected semiconductor dies) that do not meet or exceed a processing standard (e.g., that are with defects or that are with detected defects by the semiconductor die processing tool 110) may be deposited on a die vessel. As noted above, in particular embodiments processing may refer to an inspection of semiconductor dies. In certain embodiments, the fail out-port 134 may require a die vessel to receive the individually processed semiconductor dies that do not meet or exceed the processing standard. Thus, an empty die vessel may be brought by the warehousing apparatus 102 to the fail out-port 134 to receive the processed semiconductor dies at the fail out-port 134. Stated another way, the die vessel at the fail out-port 134 may be loaded with semiconductor dies at the fail out-port. This empty die vessel may be brought from the die vessel buffer 106 to the fail out-port 134 to receive the semiconductor dies processed by the semiconductor die processing tool 110. Once fully loaded, the die vessel may be inserted (e.g., combined or loaded) into a die vessel container. In certain embodiments, the fully loaded die vessel may be loaded along with other fully loaded die vessels into the die vessel container (e.g., as a stack of die vessels). In certain embodiments, the die vessel container may be brought from the die vessel container buffer 108 to the conversion station 118. At the conversion station 118, the die vessel container may receive (e.g., be combined with) at least one fully loaded die vessel from the fail out-port 134. Then, once the die vessel container is fully loaded with die vessels from the fail out-port 134, the fully loaded die vessel container may be transported by the warehousing apparatus 102 to the external system 104 for further processing.

In certain embodiments, the reprocess out-port 136 may be a location at the semiconductor die processing tool 110 in which processed semiconductor dies (e.g., inspected semiconductor dies) are to be reprocessed. This reprocessing may be utilized to determine whether the semiconductor dies meet or exceed a processing standard. As noted above, in particular embodiments processing may refer to an inspection of semiconductor dies. In certain embodiments, the reprocess out-port 136 may require a die vessel to receive the individually processed semiconductor dies for reprocessing. Reprocessing may refer to moving constituent dies of the die vessel back again to the loaded die vessel in-port 122 to be reprocessed by the semiconductor die processing tool 110. Thus, an empty die vessel may be brought by the warehousing apparatus 102 to the reprocess out-port 136 to receive the processed (e.g., inspected) semiconductor dies at the reprocess out-port 136. Stated another way, the die vessel at the reprocess out-port 136 may be loaded with semiconductor dies at the reprocess out-port 136. This empty die vessel may be brought from the die vessel buffer 106 to the reprocess out-port 136 to receive the semiconductor dies processed by the semiconductor die processing tool 110. Once fully loaded, the die vessel may be brought by the warehousing apparatus 102 to the loaded die vessel in-port 122 so that the constituent semiconductor dies may be reprocessed by the semiconductor die processing tool 110.

Figure 1C:
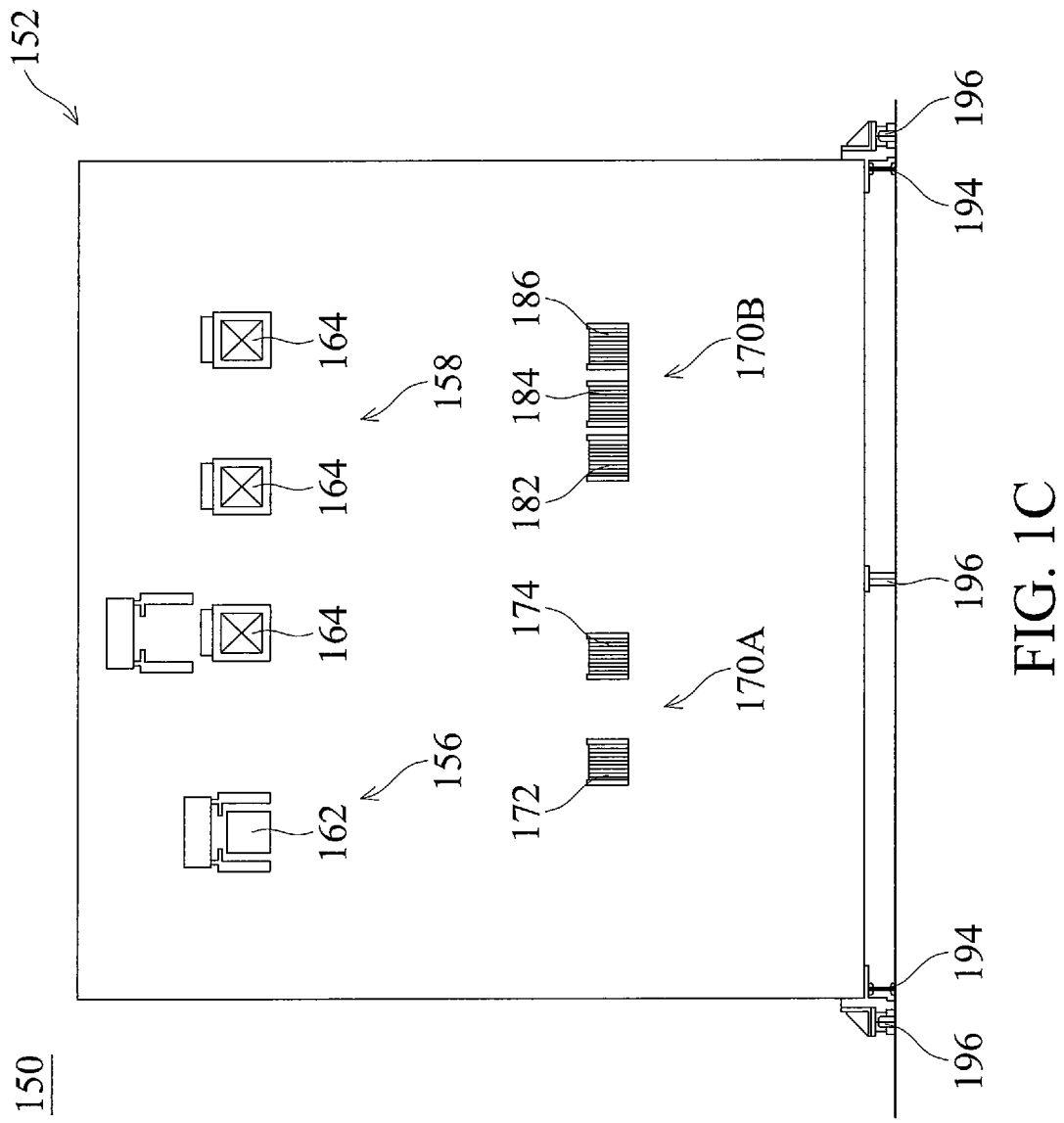
FIG. 1C is a schematic front view diagram of certain parts of a warehousing apparatus interfaced with a semiconductor die processing tool, in accordance with some embodiments.

FIG. 1C is a schematic front view diagram 150 of certain parts of a warehousing apparatus 152 interfaced with a semiconductor die processing tool, in accordance with some embodiments. As the schematic front view diagram 150 illustrates only certain parts of the warehousing apparatus 152, other parts of the warehousing apparatus 152 (e.g., a conversion station) may be present in the warehousing apparatus 152 but not illustrated in the schematic front view diagram 150. Furthermore, other aspects of the warehousing apparatus 152 and/or the semiconductor die processing tool may be illustrated with views other than the schematic front view diagram 150, as will be illustrated for example in FIGS. 2A-3B referenced below.

Returning to FIG. 1C, the schematic front view diagram 150 illustrates the warehousing apparatus 152 in front of a semiconductor die processing tool. The warehousing apparatus 152 may include a die vessel buffer 156 and a die vessel container buffer 158. In certain embodiments, the die vessel buffer 156 may be smaller in size than the die vessel container buffer 158 to accommodate die vessels containers at the die vessel container buffer 158 that are larger than the die vessels at the die vessel buffer 156. Any or a combination of the die vessel buffer 156 and the die vessel container buffer 158 may be referred to as a buffer region 160 of the warehousing apparatus 152. For example, as will be discussed further below, the buffer region 160 may be implemented as a shelf (illustrated with dotted lines) and/or a region on top of the warehousing apparatus 152 in which die vessels 162 and/or die vessel containers 164 may be stored. Accordingly, empty die vessels and/or die vessel containers may be stored within the buffer region of the warehousing apparatus at the die vessel buffer 106 or the die vessel container buffer 108.

Furthermore, a semiconductor die processing tool may include an in-port 170A and an out-port 170B. More specifically, each of the in-port 170A and the out-port 170B may include sub-ports. These sub-ports may be parts of the in-port 170A and/or the out-port 170B. For example, the in-port 170A may have a loaded die vessel in-port 172 and an empty die vessel in-port 174. The loaded die vessel in-port 172 may be an in-port to the semiconductor die processing tool in which a die vessel with dies that are to be processed by the semiconductor die processing tool may be received by the semiconductor die processing tool. The entire die vessel may be ingested by the semiconductor die processing tool with the individual constituent dies of the die vessel taken by the semiconductor die processing tool for processing. Then, after the individual constituent dies of the die vessel are taken by the semiconductor die processing tool for processing, the empty die vessel may be provided at the empty die vessel in-port 174. The warehousing apparatus 152 may take the empty die vessel from the empty die vessel in-port 174 for storage at the die vessel buffer 156.

In certain embodiments, the out-port 170B may have, as sub-ports, a pass out-port 182, a fail out-port 184, and a reprocess out-port 186. The pass out-port 182 may be a location at the semiconductor die processing tool in which processed semiconductor dies (e.g., inspected semiconductor dies) that meet or exceed a processing standard (e.g., that are without defects or that are without detected defects by the semiconductor die processing tool) may be deposited on a die vessel. As noted above, in particular embodiments processing may refer to an inspection of semiconductor dies. In certain embodiments, the pass out-port 182 may require a die vessel to receive the individually processed semiconductor dies that meet or exceed the processing standard. Thus, an empty die vessel may be brought by the warehousing apparatus 152 to the pass out-port 182 to receive the processed semiconductor dies at the pass out-port 182. Stated another way, the die vessel at the pass out-port 182 may be loaded with semiconductor dies at the pass out-port. This empty die vessel may be brought from the die vessel buffer 156 to the pass out-port 182 to receive the semiconductor dies processed by the semiconductor die processing tool. Once fully loaded, the die vessel may be inserted (e.g., combined or loaded) into a die vessel container. In certain embodiments, the fully loaded die vessel may be loaded along with other fully loaded die vessels into the die vessel container (e.g., as a stack of die vessels). In certain embodiments, the die vessel container may be brought from the die vessel container buffer 158 to a conversion station. At the conversion station, the die vessel container may receive (e.g., be combined with) at least one fully loaded die vessel from the pass out-port 182. Then, once the die vessel container is fully loaded with die vessels from the pass out-port 182, the fully loaded die vessel container may be transported by the warehousing apparatus 152 to an external system for further processing.

In certain embodiments, the fail out-port 184 may be a location at the semiconductor die processing tool in which processed semiconductor dies (e.g., inspected semiconductor dies) that do not meet or exceed a processing standard (e.g., that are with defects or that are with detected defects by the semiconductor die processing tool) may be deposited on a die vessel. As noted above, in particular embodiments processing may refer to an inspection of semiconductor dies. In certain embodiments, the fail out-port 184 may require a die vessel to receive the individually processed semiconductor dies that do not meet or exceed the processing standard. Thus, an empty die vessel may be brought by the warehousing apparatus 152 to the fail out-port 184 to receive the processed semiconductor dies at the fail out-port 184. Stated another way, the die vessel at the fail out-port 184 may be loaded with semiconductor dies at the fail out-port. This empty die vessel may be brought from the die vessel buffer 156 to the fail out-port 184 to receive the semiconductor dies processed by the semiconductor die processing tool. Once fully loaded, the die vessel may be inserted (e.g., combined or loaded) into a die vessel container. In certain embodiments, the fully loaded die vessel may be loaded along with other fully loaded die vessels into the die vessel container (e.g., as a stack of die vessels). In certain embodiments, the die vessel container may be brought from the die vessel container buffer 158 to a conversion station. At the conversion station, the die vessel container may receive (e.g., be combined with) at least one fully loaded die vessel from the fail out-port 184. Then, once the die vessel container is fully loaded with die vessels from the fail out-port 184, the fully loaded die vessel container may be transported by the warehousing apparatus 152 to the external system for further processing.

In certain embodiments, the reprocess out-port 186 may be a location at the semiconductor die processing tool in which processed semiconductor dies (e.g., inspected semiconductor dies) are to be reprocessed. This reprocessing may be utilized to determine whether the semiconductor dies meet or exceed a processing standard. As noted above, in particular embodiments processing may refer to an inspection of semiconductor dies. In certain embodiments, the reprocess out-port 186 may require a die vessel to receive the individually processed semiconductor dies for reprocessing. Reprocessing may refer to moving constituent dies of the die vessel back again to the loaded die vessel in-port 172 to be reprocessed by the semiconductor die processing tool. Thus, an empty die vessel may be brought by the warehousing apparatus 152 to the reprocess out-port 186 to receive the processed (e.g., inspected) semiconductor dies at the reprocess out-port 186. Stated another way, the die vessel at the reprocess out-port 186 may be loaded with semiconductor dies at the reprocess out-port 186. This empty die vessel may be brought from the die vessel buffer 156 to the reprocess out-port 186 to receive the semiconductor dies processed by the semiconductor die processing tool. Once fully loaded, the die vessel may be brought by the warehousing apparatus 152 to the loaded die vessel in-port 172 so that the constituent semiconductor dies may be reprocessed by the semiconductor die processing tool.

In various embodiments, the warehousing apparatus 152 may include a number of robotic arms 190 to manipulate a die vessel, a stack of die vessels, and/or a die vessel container. For example, the robotic arms 190 of the warehousing apparatus 152 may be configured to separate die vessels from die vessel containers and to move the die vessels to and from the in-port 170A and the out-port 170B of the semiconductor die processing tool. Furthermore, the robotic arms 190 may be configured to move empty die vessels to the die vessel buffer 156 and to move empty die vessel containers to and from the die vessel container buffer 158. These die vessel containers and die vessels may be warehoused (e.g., stored) within the buffer region 160 (e.g., the shelf) of the warehousing apparatus 152 to await a time when the empty die vessels 162 and/or empty die vessel containers 164 can be utilized to receive dies that have been processed by the semiconductor die processing tool. These die vessel containers 164 may be received from and transferred to a source external (e.g., the external system) to the warehousing apparatus, such as an automated guided vehicle, automated material handling system, or an operator of the semiconductor die processing tool.

In certain embodiments, the warehousing apparatus 152 may be configured to be moved via wheels 196 and secured in an immobile manner by a leveler foot 194. The wheels 196 may allow the warehousing apparatus 152 to be moved around (e.g., wheeled around). Also, the leveler foot 194 may be configured to anchor the warehousing apparatus 152 in place as desired. For example, each of the leveler foot 194 and the wheels 196 may be attached to a bottom of the warehousing apparatus 152. The leveler foot may be configured to extend (e.g., via rotation within the context of threads or screws) from the bottom of the warehousing apparatus 152 to a height greater than a height of the wheel, thus lifting the wheel off the ground and securing the warehousing apparatus 152 to the ground in an immobile manner. Alternatively, the leveler foot may be configured to extend (e.g., via rotation within the context of threads or screws) from the bottom of the warehousing apparatus 152 to a height smaller than a height of the wheels 196 such that the wheels 196 may touch the ground, thus allowing the warehousing apparatus 152 to be moved via rotational movement of the wheels 196 that contact the ground.

Figure 2A:
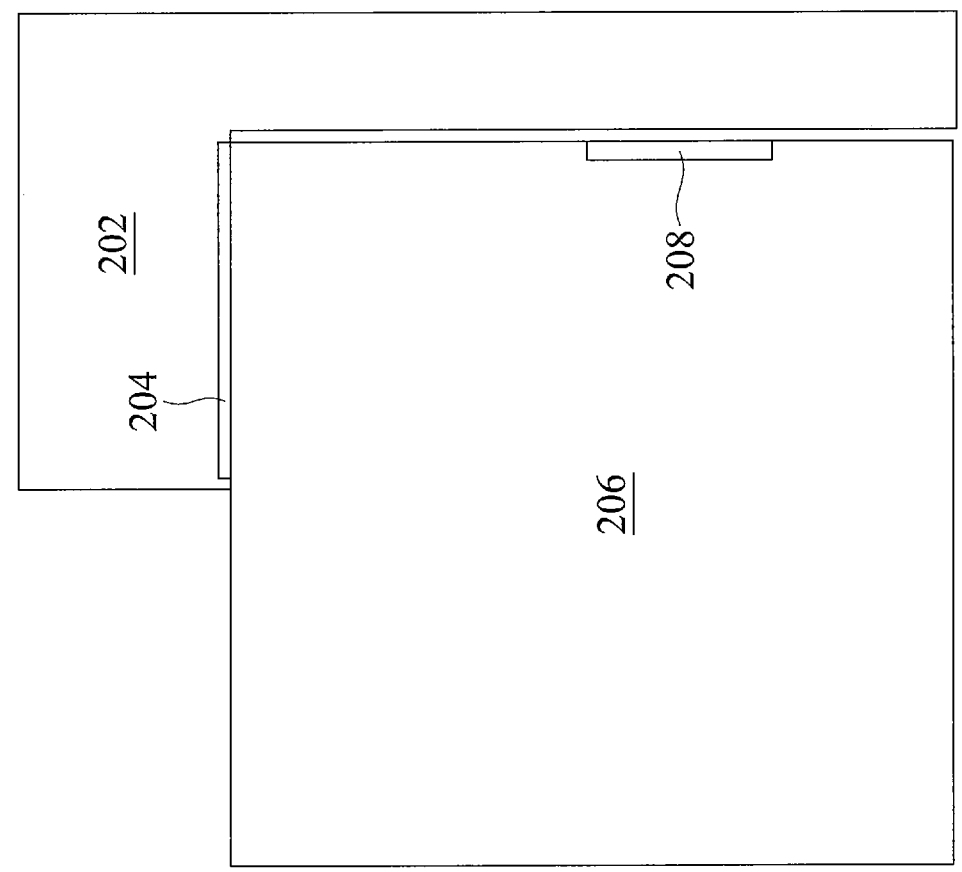
FIG. 2A is a side view block diagram of a warehousing apparatus with a buffer region on top of the semiconductor die processing tool, in accordance with some embodiments.

FIG. 2A is a side view block diagram 200 of a warehousing apparatus 202 with a buffer region 204 on top of the semiconductor die processing tool 206, in accordance with some embodiments. The buffer region 204 is illustrated with a rectangle for ease of explanation in this side view block diagram 200 but represents a region on top of the warehousing apparatus 202. Stated another way, the buffer region 204 may be a region on top of the semiconductor die processing tool 206 in which die vessels may be located in a die vessel buffer. Similarly, the buffer region 204 may be a region on top of the semiconductor die processing tool 206 in which die vessel containers may be located at a die vessel container buffer.

As noted above, any or a combination of a die vessel buffer and a die vessel container buffer may be referred to as the buffer region of the warehousing apparatus 202. Accordingly, empty die vessels and/or die vessel containers may be stored within the buffer region 204 of the warehousing apparatus 202 at either the die vessel buffer or the die vessel container buffer.

Also, as noted above, the warehousing apparatus 202 may be configured to interface with an in-port and an out-port of the semiconductor die processing tool 206. Any or a combination of the in-port and the out-port may be referred to more generally as a port 208 of the semiconductor die processing tool 206. As illustrated, the port 208 may be on a lateral side of the semiconductor die processing tool 206. Also, the port 208 is illustrated with a rectangle for ease of illustration to illustrate where a port may be located in this side view block diagram 200.

Figure 2B:
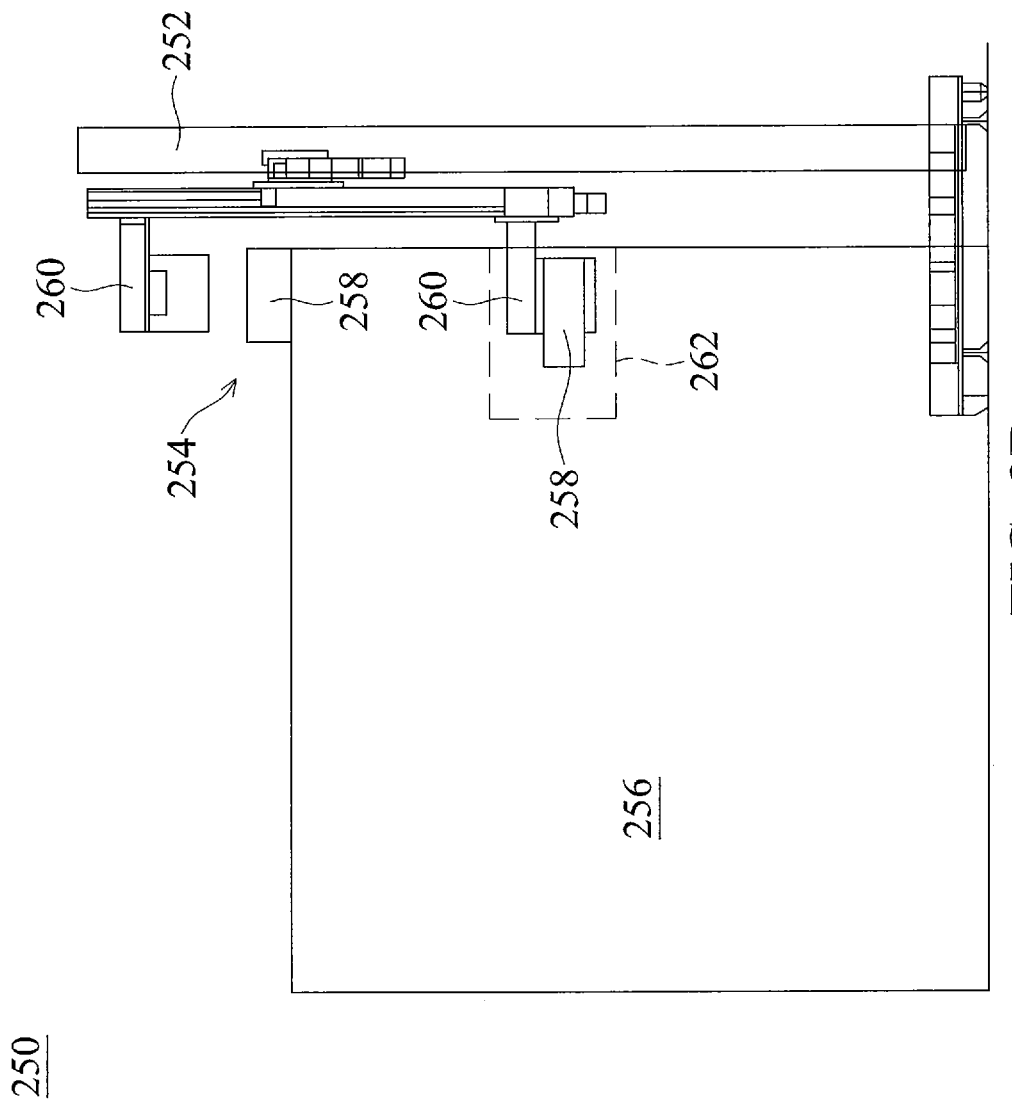
FIG. 2B is a side view block diagram of a warehousing apparatus with a buffer region on top of a semiconductor die processing tool, in accordance with some embodiments.

FIG. 2B is a side view block diagram 250 of a warehousing apparatus 252 with a buffer region 254 on top of the semiconductor die processing tool 256, in accordance with some embodiments. The buffer region 254 may be located on top of the semiconductor die processing tool 256 in which die vessels may be located in a die vessel buffer. Also, die vessel containers may be located at a die vessel container buffer of the buffer region 254. As illustrated, a stack of die vessels 258 (e.g., a number of die vessels, one on top of another) may be located on top of the semiconductor die processing tool 256 or as grasped by a robotic arm 260 of the warehousing apparatus 252.

As noted above, any or a combination of a die vessel buffer and a die vessel container buffer may be referred to as a buffer region of the warehousing apparatus 202 and may be located on top of the semiconductor die processing tool 256. Accordingly, empty die vessels and/or empty die vessel containers may be stored within the buffer region 254 of the warehousing apparatus 252 at the die vessel buffer or the die vessel container buffer.

Also, as noted above, the warehousing apparatus 252 may be configured to interface with an in-port and an out-port of the semiconductor die processing tool 256. Any or a combination of the in-port and the out-port may be referred to more generally as a port 262 (illustrated with dotted lines) of the semiconductor die processing tool 256. As illustrated, the port 262 may be on a lateral side of the semiconductor die processing tool 256. Also, the port 262 is illustrated with a dotted line rectangle for ease of illustration to illustrate where the port 262 may be located in this side view block diagram 250. Furthermore, the robotic arm 260 of the warehousing apparatus 252 may hold a stack of die vessels 258 and be extended within the port 262. In certain embodiments, the robotic arm 260 may have multiple degrees of freedom, and thus capable of moving an end effector of the robotic arm 260 in three dimensions (e.g., along an x, y, and z axis). In certain embodiments, a warehousing apparatus 252 may have multiple robotic arms 260, each configured to respectively hold and manipulate a stack of die vessels 258.

FIG. 3A is a side view block diagram 300 of a warehousing apparatus 302 with a buffer region 304 on a shelf connected to a semiconductor die processing tool 306, in accordance with some embodiments. The buffer region 304 is illustrated with a rectangle for ease of explanation in this side view block diagram 300 but represents a region on a shelf connected to the warehousing apparatus 302. Stated another way, the buffer region 304 may be a region on top of the shelf in which die vessels may be located in a die vessel buffer. Similarly, the buffer region 304 may be a region on top of the shelf in which die vessel containers may be located at a die vessel container buffer.

As noted above, any or a combination of a die vessel buffer and a die vessel container buffer may be referred to as a buffer region 304 of the warehousing apparatus 302. Accordingly, empty die vessels and/or die vessel containers may be stored within the buffer region 304 of the warehousing apparatus 302 at either the die vessel buffer or the die vessel container buffer.

Also, as noted above, the warehousing apparatus 302 may be configured to interface with an in-port and an out-port of the semiconductor die processing tool 306. Any or a combination of the in-port and the out-port may be referred to more generally as a port 308 of the semiconductor die processing tool 306. As illustrated, the port 308 may be on a lateral side of the semiconductor die processing tool 306. Also, the port 308 is illustrated with a rectangle for ease of illustration to illustrate where a port may be located in this side view block diagram 300.

Figure 3B:
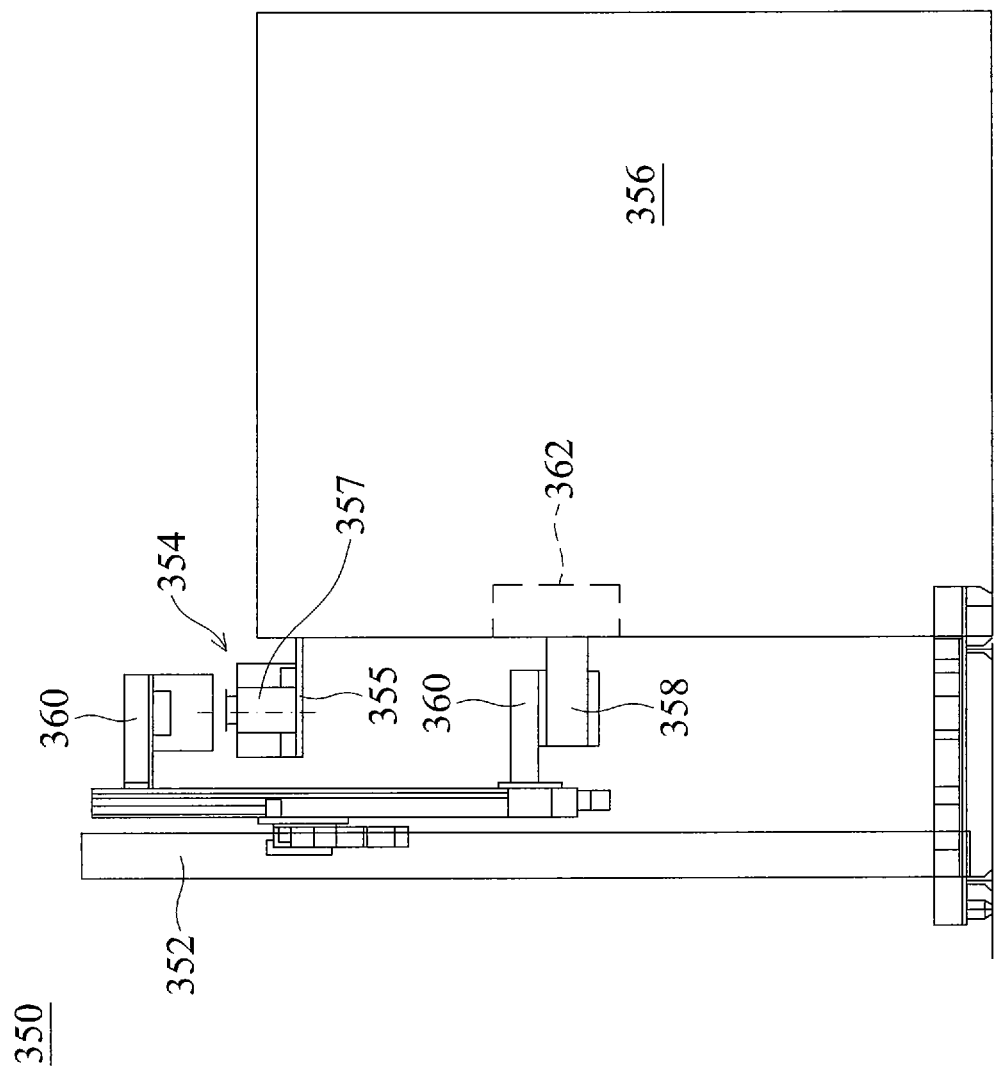
FIG. 3B is a side view block diagram of a warehousing apparatus with a buffer region on top of a shelf attached to a semiconductor die processing tool, in accordance with some embodiments.

FIG. 3B is a side view block diagram 350 of a warehousing apparatus 352 with a buffer region 354 on top of a shelf attached to a semiconductor die processing tool 356, in accordance with some embodiments. The buffer region 354 may be located on top of a shelf 355 attached to the semiconductor die processing tool 356. At the buffer region 354, die vessels may be located in a die vessel buffer or die vessel containers may be located at a die vessel container buffer. As illustrated, a die vessel container 357 may be within the buffer region 354 and a stack of die vessels 358 (e.g., a number of die vessels, one on top of another) may be grasped by a robotic arm 360 of the warehousing apparatus 352. In certain embodiments, the robotic arm 360 may have multiple degrees of freedom, and thus capable of moving an end effector of the robotic arm 360 in three dimensions (e.g., along an x, y, and z axis).

As noted above, any or a combination of a die vessel buffer and a die vessel container buffer may be referred to as a buffer region of the warehousing apparatus 352 and may be located on the shelf 355 attached to the semiconductor die processing tool 356. Accordingly, empty die vessels and/or die vessel containers may be stored within the buffer region 354 of the warehousing apparatus 352 at the die vessel buffer or the die vessel container buffer.

Also, as noted above, the warehousing apparatus 352 may be configured to interface with an in-port and an out-port of the semiconductor die processing tool 356. Any or a combination of the in-port and the out-port may be referred to more generally as a port 362 (illustrated with dotted lines) of the semiconductor die processing tool 356. As illustrated, the port 362 may be on a lateral side of the semiconductor die processing tool 356. Also, the port 362 is illustrated with a dotted line rectangle for ease of illustration to illustrate where the port 362 may be located in this side view block diagram 350. Furthermore, the robotic arm 360 of the warehousing apparatus 352 may hold a stack of die vessels 358 for entry into or exit from the port 262.

Figure 4A:
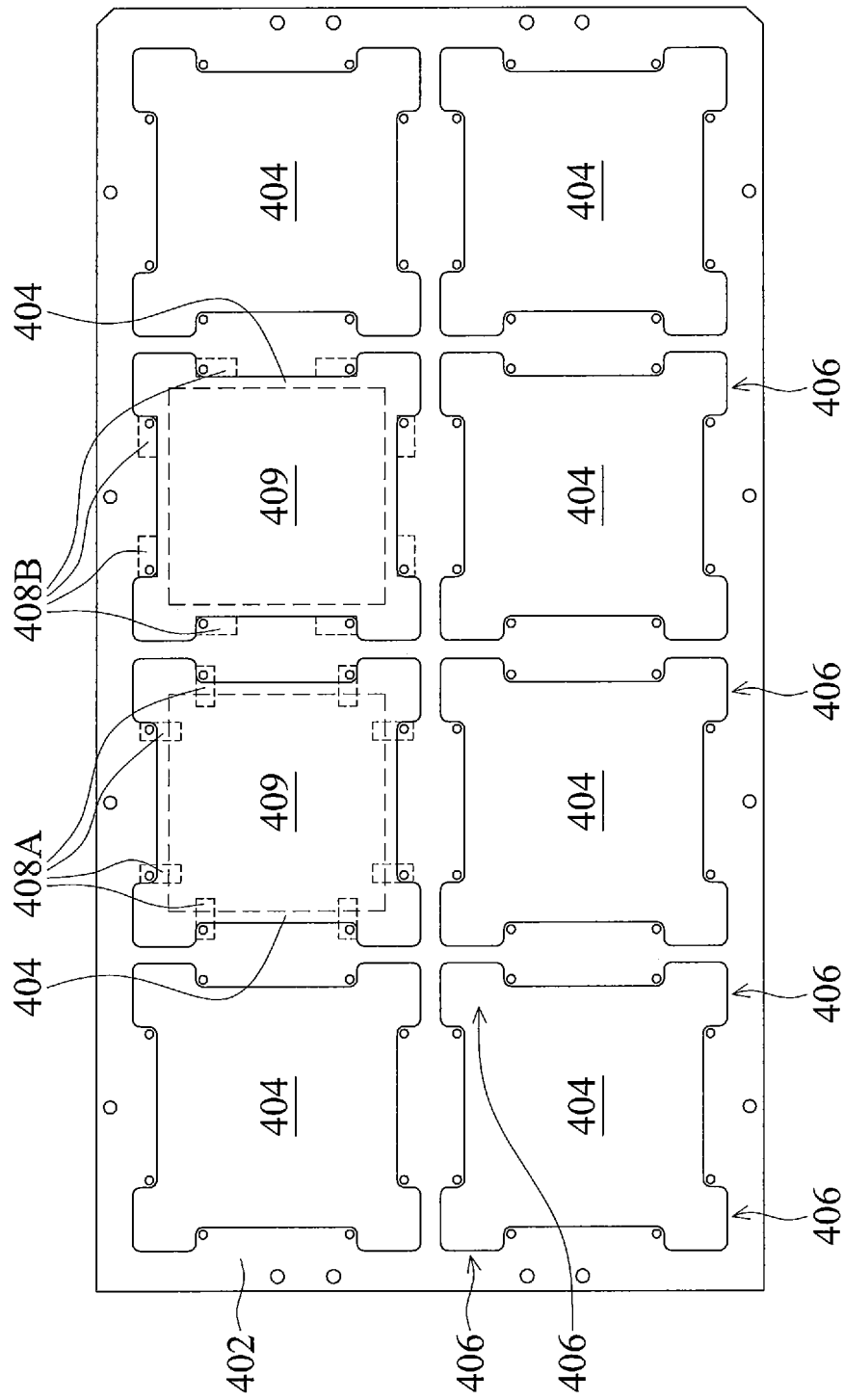
FIG. 4A is a schematic diagram of a die vessel, in accordance with some embodiments.

FIG. 4A is a schematic diagram of a die vessel 402, in accordance with some embodiments. The die vessel 402 may include a number of receptacles 404 in which to a die may be placed. For example, there may be eight receptacles 404, as illustrated in the embodiment of FIG. 4A. Each of the receptacles may be substantially rectangular in shape with a further protrusion along the square corner portions 406 of a respective receptacle 404. Optionally, each of the square corner portions 406 may be adjacent to pin holes in which a pin 408A, 408B may be disposed. The pins 408A, 408B may be configured (e.g., rotated) to be disposed over a die when the die is to be transported using the die vessel 402 and to be removed from over the die when the die is not to be transported using the die vessel. For example, pins 408A (drawn in phantom) illustrate how the pins 408A is disposed over a die 409 (drawn in phantom) when the die is to be transported using the die vessel 402. Also, pins 408B (drawn in phantom) illustrate how the pins 408B are not disposed over a die 409 when the die 409 is not to be transported using the die vessel 402 (e.g., to be removed from the die vessel).

Figure 4B:
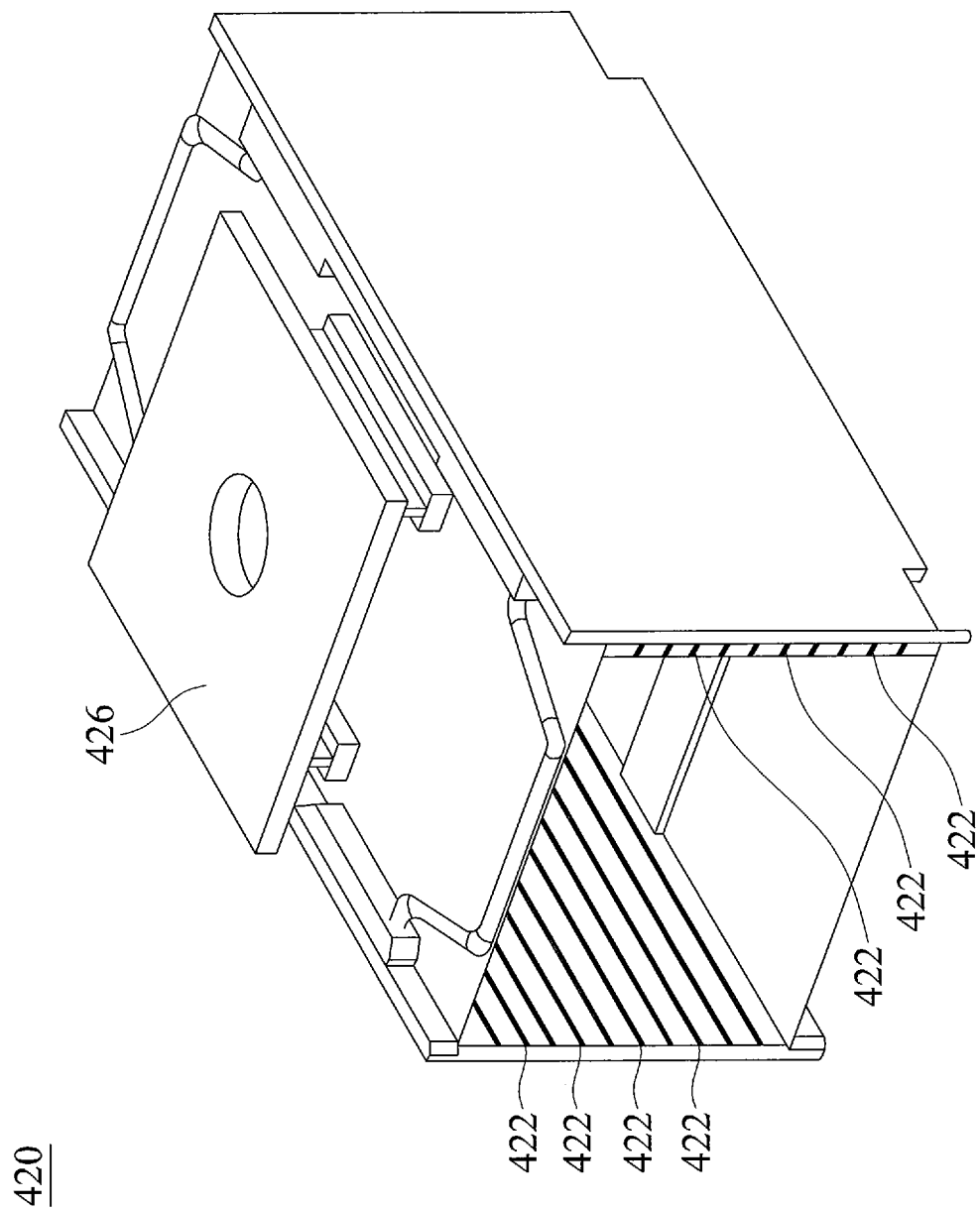
FIG. 4B is a perspective view diagram of a slotted die vessel container, in accordance with some embodiments.

FIG. 4B is a perspective view diagram of a slotted die vessel container 420, in accordance with some embodiments. The slotted die vessel container 420 may include slots 422. The slots 422 may be concavities from which die vessels may be secured and/or guided along during insertion or removal. When within a slotted die vessel container 420, the die vessels may be located at set predetermined vertical distances from each other, as determined by the slots 422 in the slotted die vessel container 420. In particular embodiments, the slotted die vessel container 420 may include a handle 426, using which a robotic arm may be configured to secure and move the slotted die vessel container 420.

FIG. 4C is a front view diagram of the slotted die vessel container 420, in accordance with some embodiments. As illustrated, the slots 422 may be concavities from which die vessels may be secured and/or guided along during insertion or removal. The handle 426 may be a protrusion using which a robotic arm may be configured to secure and manipulate the slotted die vessel container 420.

Figure 4D:
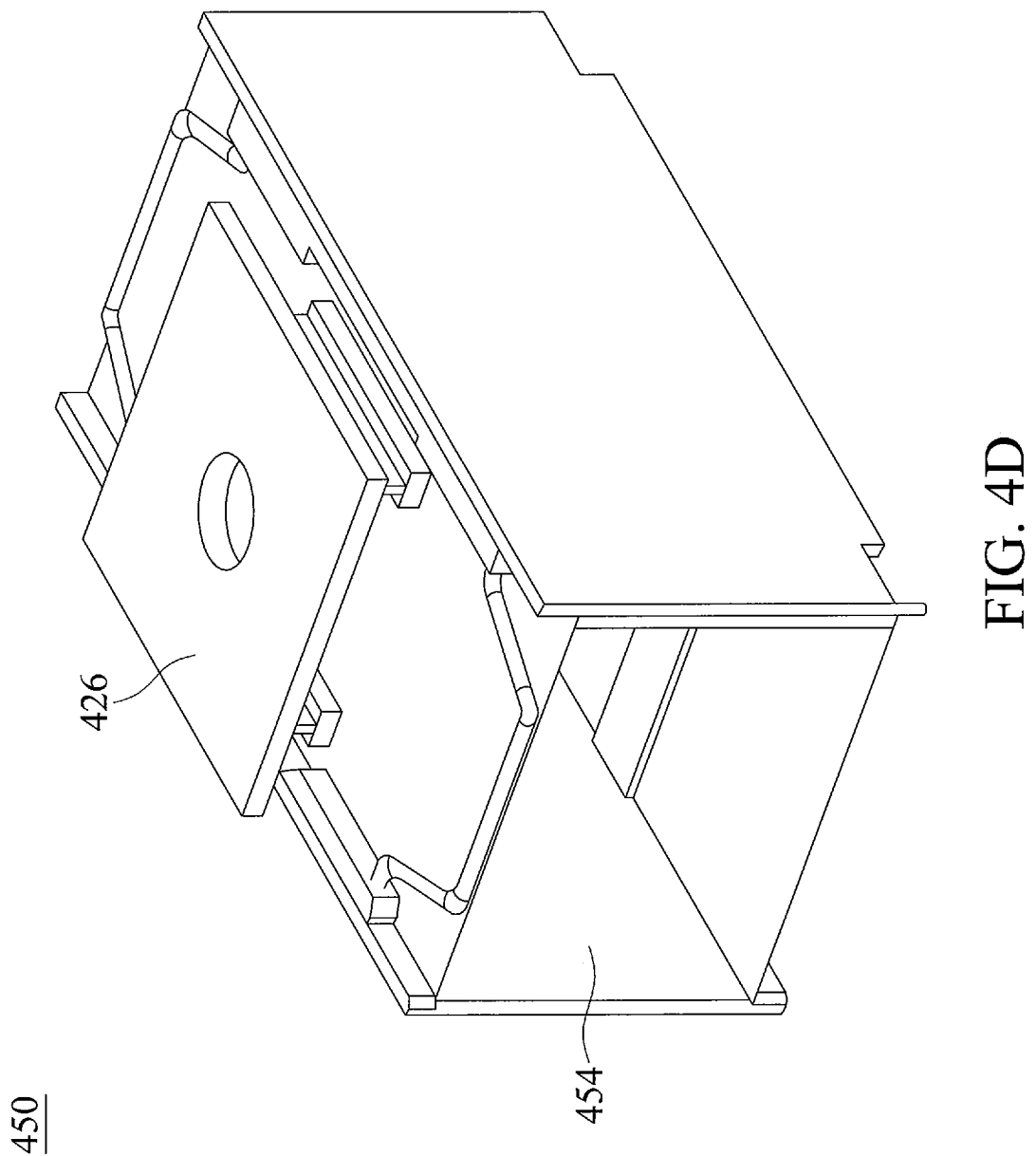
FIG. 4D is a perspective view diagram of a stackable die vessel container, in accordance with some embodiments.

FIG. 4D is a perspective view diagram of a stackable die vessel container 450, in accordance with some embodiments. The stackable die vessel container 450 may be configured to store die vessels stacked one on the other. For example, the stackable die vessel container 450 may include smooth internal walls 454 without specific concavities such as slots in which die vessels may be disposed and/or guided along. In particular embodiments, the stackable die vessel container 450 may include a handle 456, using which a robotic arm may be configured to secure and move the stackable die vessel container 450.

Figure 4E:
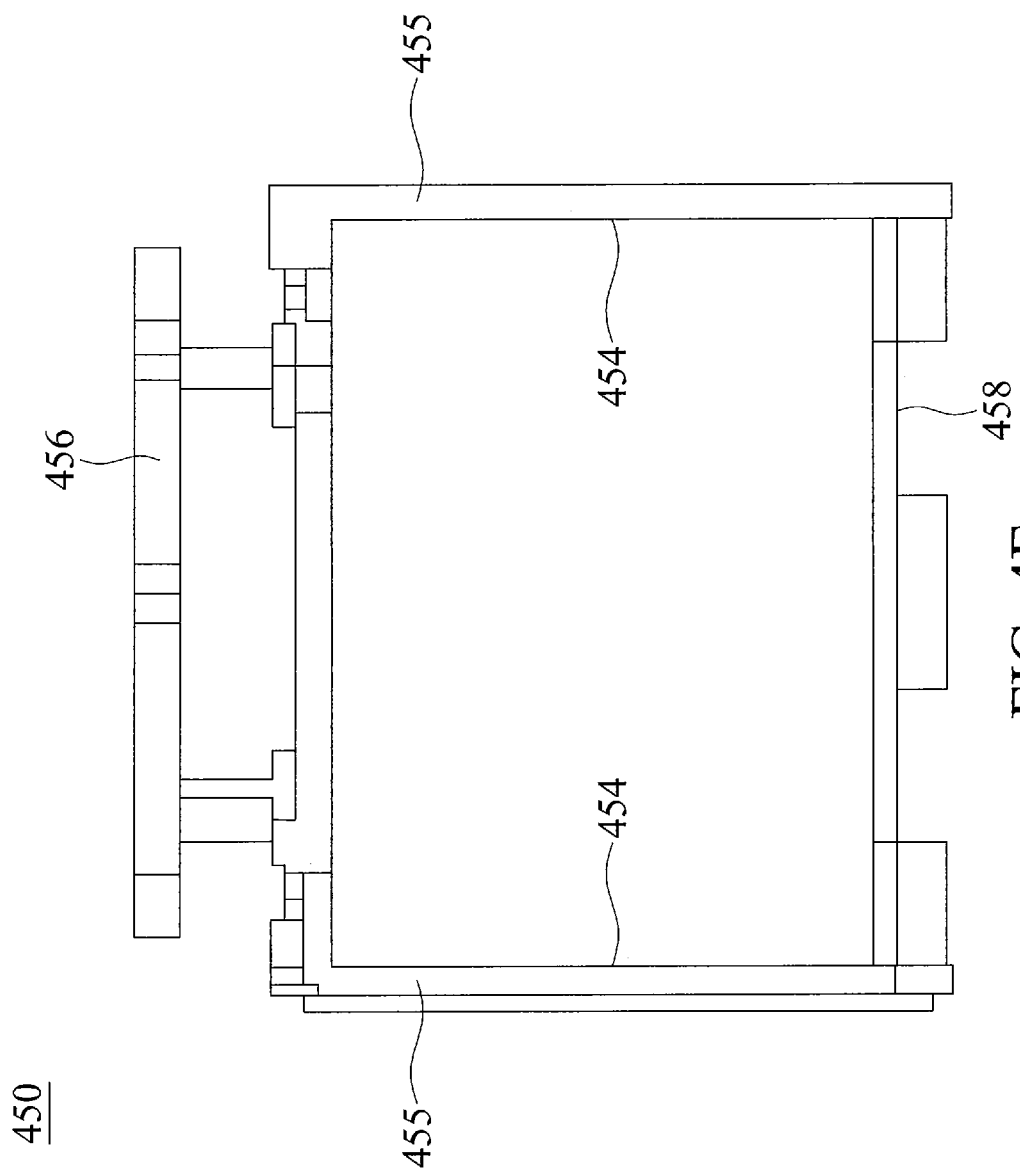
FIG. 4E is a front view diagram of the stackable die vessel container, in accordance with some embodiments.

FIG. 4E is a front view diagram of the stackable die vessel container 450, in accordance with some embodiments. As illustrated, internal walls 454 of the stackable die vessel container 450 may be substantially smooth and without specific concavities such as slots in which die vessels may be disposed. The internal walls 454 may be part of the sidewalls 455 of the stackable die vessel container 450. Also, the handle 456 may protrude from the stackable die vessel container 450. Furthermore, the stackable die vessel container 450 may include a bottom wall 458. This bottom wall may be considered to be part of the stackable die vessel container 450 when connected with the side walls 455 and not part of the stackable die vessel container 450 when not connected with the side walls 455. In certain embodiments, being connected to the side walls 455 may refer to a physical connection and/or a physical securement to the side walls 455, such as via holding pins that may be rotated to a first position to secure the bottom wall 458 to the side walls 455 and rotated to a second position to not secure the bottom wall 458 to the side walls 455.

FIG. 4F is a bottom view diagram of the stackable die vessel container 450, in accordance with some embodiments. As noted above, the stackable die vessel container 450 may include the bottom wall 458. This bottom wall may be considered to be part of the stackable die vessel container 450 when connected with the side walls 455 and not part of the stackable die vessel container 450 when not connected with the side walls 455. In certain embodiments, being connected to the side walls 455 may refer to a physical connection and/or a physical securement to the side walls 455, such as via holding pins 460 that may be rotated to a first position to secure the bottom wall 458 to the side walls 455 and rotated to a second position to not secure the bottom wall 458 to the side walls 455. In certain embodiments, a die vessel container holding structure and/or a die vessel holding structure may remove (e.g., rotate) the holding pins 460 from securing a bottom wall of the die vessel container (e.g., by rotating pins away from the first position in which they secure the bottom wall of the die vessel container).

Figure 5A:
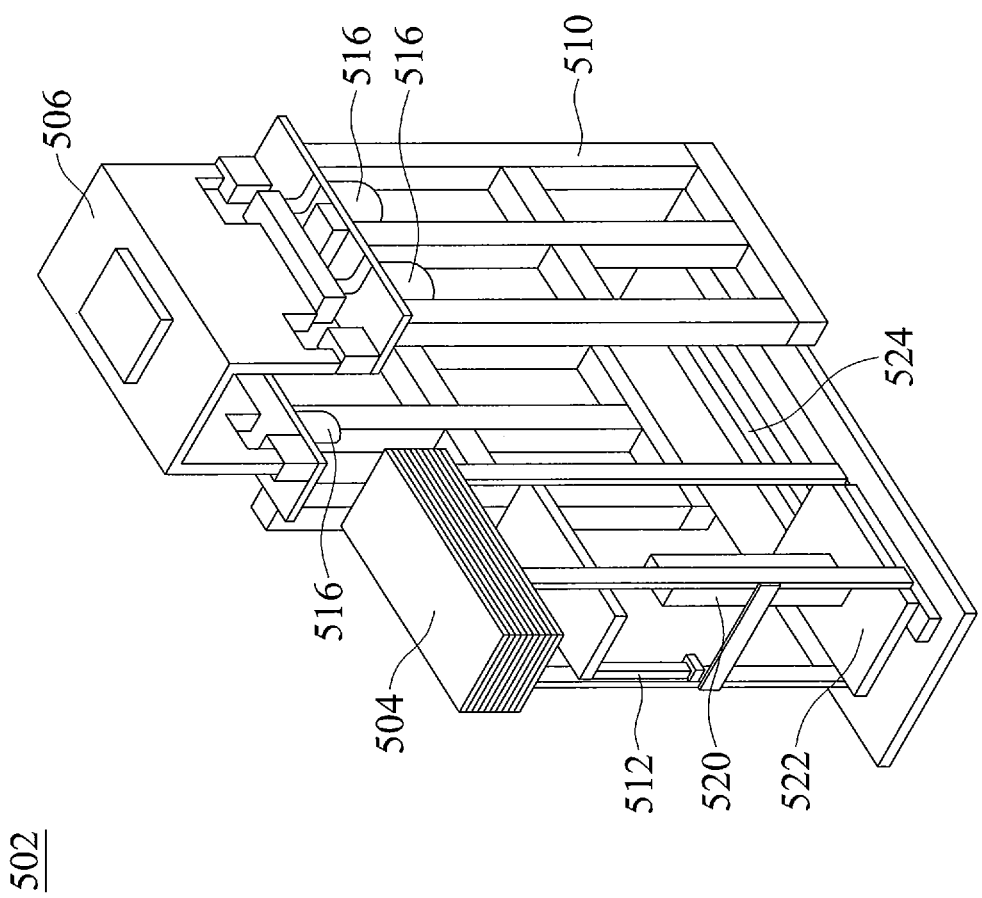
FIG. 5A is a perspective view of a conversion station interfaced with a stackable die vessel container, in accordance with some embodiments.
Figure 5B:
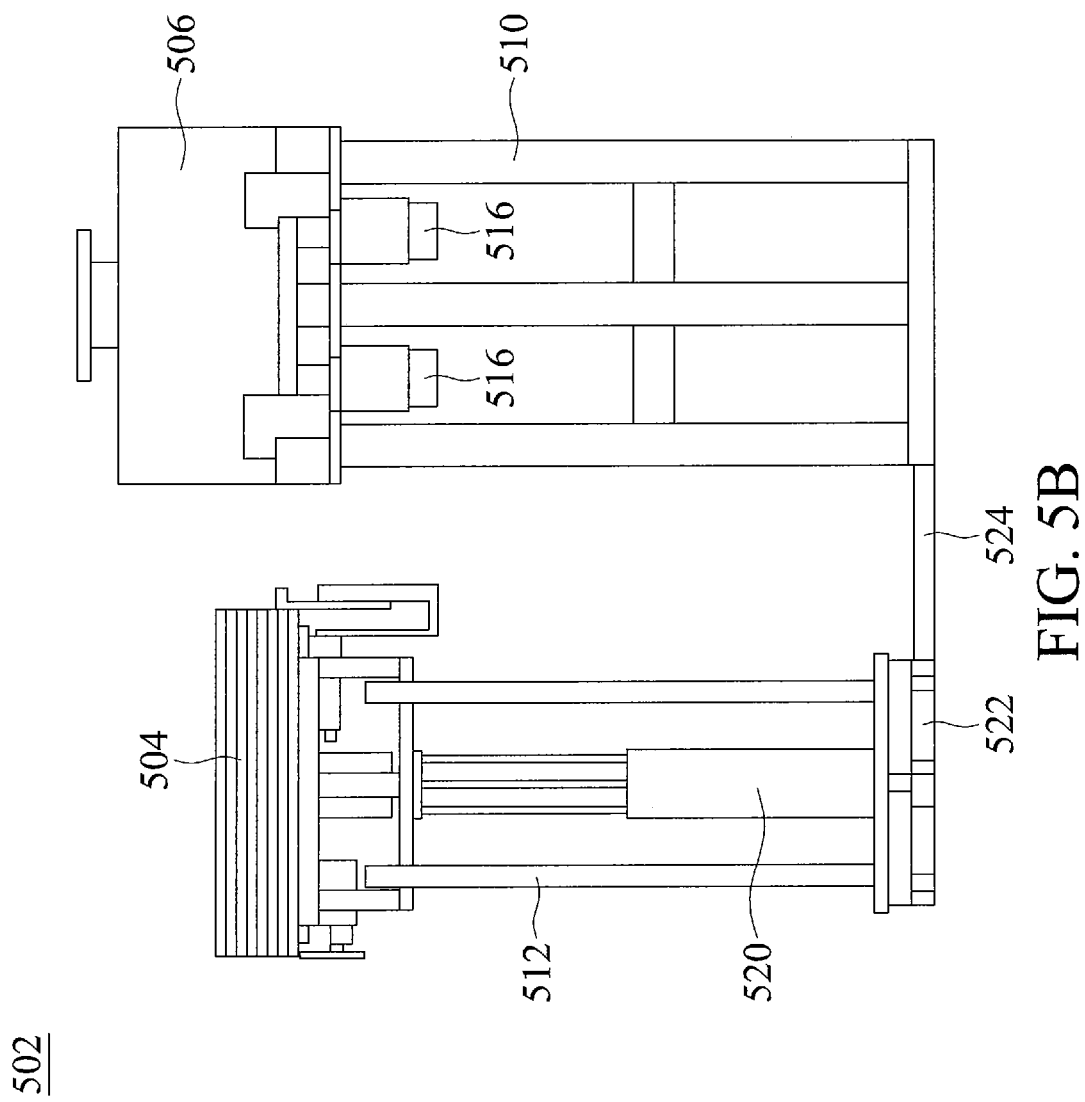
FIG. 5B is a side view of the conversion station interfaced with the stackable die vessel container, in accordance with some embodiments.

FIG. 5A is a perspective view of a conversion station 502 interfaced with a stackable die vessel container, in accordance with some embodiments. Also, FIG. 5B is a side view of the conversion station 502 interfaced with the stackable die vessel container, in accordance with some embodiments. In reference to both FIGS. 5A and 5B, the conversion station 502 may be a part of (e.g., a region of) the warehousing apparatus in which die vessels 504 are disassembled from die vessel containers 506 or where die vessels 504 are combined within a die vessel container 506. In certain embodiments, the die vessel container 506 may be a stackable die vessel container 506, which may contrast with a slotted die vessel container. A slotted die vessel container may include slots in which die vessels may be disposed with vertical clearance from each other (e.g., not stacked). When the die vessel container is a slotted die vessel container, a robotic arm may remove die vessels from the slotted die vessel container and/or place die vessels into the slotted die vessel container one by one in accordance with the slots within the slotted die vessel container. In contrast, die vessels 504 in a stackable die vessel container 506 may be stacked one on top of another in the stackable die vessel container 506 such that the die vessels form a die vessel stack, or a stack of die vessels 504. When the die vessel container is a stackable die vessel container 506, the conversion station 502 may include a die vessel container holding structure 510 in which a die vessel container 506 may be held while the die vessels 504 are to be removed from the die vessel container 506 and/or while the die vessels 504 are to be moved into the die vessel container 506. In certain embodiments, the conversion station 502 may also include a die vessel holding structure 512 in which the stack of die vessels 504 may be held during removal from the stackable die vessel container 506 or entry into the stackable die vessel container 506. For example, the stackable die vessel container 506 may be secured on the die vessel container holding structure 510 with a bottom wall of the die vessel container 506 secured on the die vessel holding structure 512 (e.g., not the die vessel container holding structure 510). As noted above, the die vessel container holding structure 510 may remove holding pins from securing a bottom wall of the die vessel container via a rotator 516 on the die vessel container holding structure 510. The rotator 516 may be configured to rotate the holding pins away from a position in which they secure the bottom wall of the die vessel container to the sidewalls of the die vessel container, as noted above. Then the die vessel holding structure 512 may be moved away from the die vessel container holding structure 510, removing the die vessels 504 (e.g., the stack of die vessels) from the die vessel container 506. For example, the die vessel holding structure 512 may be moved away from the die vessel container holding structure 510 by vertical displacement (e.g., lowering the stack of die vessels 504 relative to the die vessel container 506 or raising the die vessel container 506 relative to the stack of die vessels 504) using a vertical actuator 520 and then lateral displacement (e.g., by laterally moving the die vessel container 506 relative to the stack of die vessels 504 or laterally moving the stack of die vessels 504 relative to the die vessel container 506) using a lateral actuator 522 (e.g., along rails 524). In certain embodiments, the die vessel holding structure 512 may be under (e.g., supporting) the die vessel container 506 at an initial stage prior to die vessel 504 disassembly from a die vessel container 506.

Figure 5C:
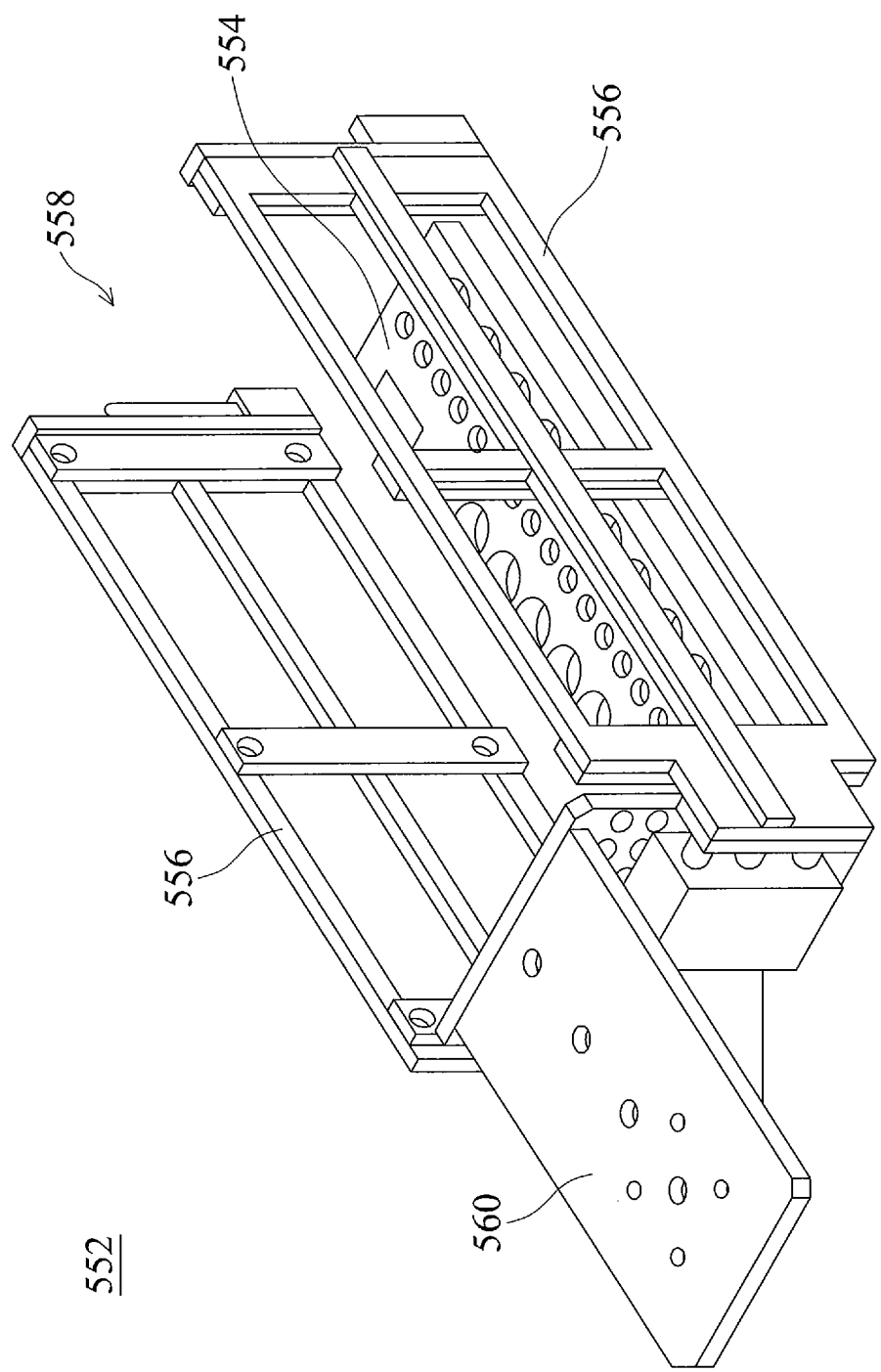
FIG. 5C is a rear perspective view of an end effector for a stackable die vessel container, in accordance with some embodiments.
Figure 5D:
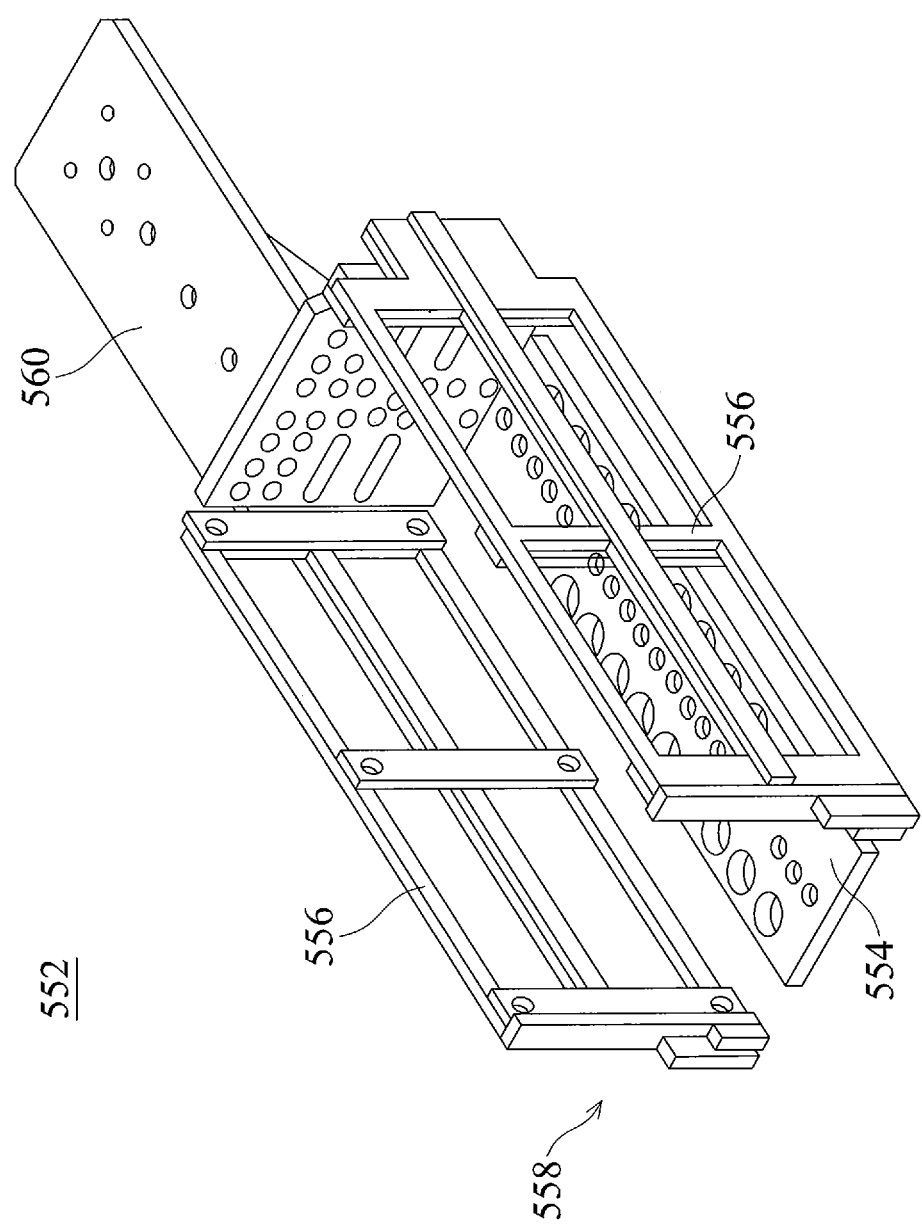
FIG. 5D is a front perspective view of the end effector for the stackable die vessel container, in accordance with some embodiments.

FIG. 5C is a rear perspective view of an end effector 552 for a stackable die vessel container, in accordance with some embodiments. Also, FIG. 5D is a front perspective view of the end effector 552 for the stackable die vessel container, in accordance with some embodiments. With reference to FIGS. 5C and 5D, in particular embodiments, a die vessel stack robotic arm may be a specialized robotic arm with the end effector 552 configured to secure a stack of die vessels. The die vessel stack robotic arm end effector 552 may include a lower surface 554 configured to slide under a bottom wall of a die vessel container and/or the lowest die vessel of the stack of die vessels to move the stack of die vessels. The die vessel stack robotic arm end effector 552 may also include side gates 556 configured to laterally support the stack of die vessels so that individual die vessels do not slide off of the stack of die vessels while in transit. The die vessel stack robotic arm end effector 552 may include an open front 558 opposite to a rear portion 560 which interfaces with the rest of the die vessel stack robotic arm. For example, the stack of die vessels may be moved to and/or from any of a die vessel buffer, conversion station, in-port, out-port, or any other part of the warehousing apparatus. Furthermore, although a specific type of end effector and a specific type of robotic arm is discussed above, any type of end effector and any type of robotic arm may be utilized in the warehousing apparatus as desired for different applications in various embodiments. For example, a specialized robotic arm may be utilized for slotted die vessel containers (e.g., different than the die vessel stack robotic arm) to individually manipulate die vessels (e.g., die vessels not arranged in a stack). Furthermore, additional types of end effectors may be utilized in a robotic arm of the warehousing apparatus for grasping or holding an object, such as a pressure gripper (e.g., gripping by applying pressure to an object, such as with a pincer type motion), an area gripper (e.g., gripping by surrounding an object to be manipulated), a vacuum gripper (e.g., gripping by suction force), a magnetic gripper (e.g., gripping by use of electromagnetic forces) and the like. In certain embodiments, the end effector may utilize at least two fingers, with one opposing the other. The multiple fingers may be utilized to apply pressure as a pressure gripper and or as an area gripper.

Figure 6:
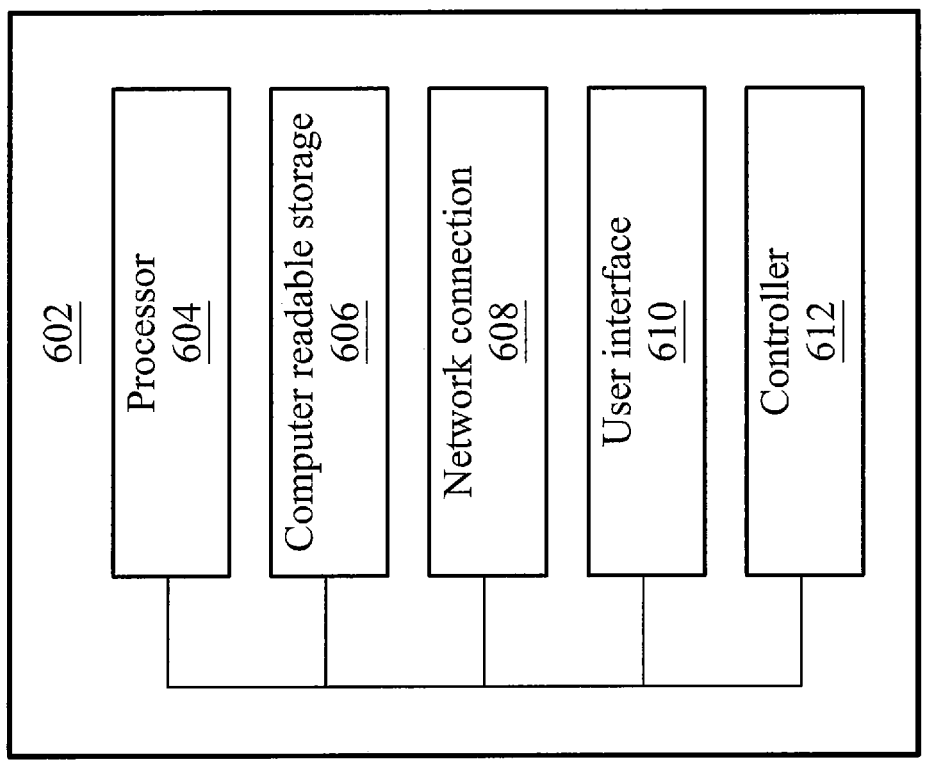
FIG. 6 is a block diagram of various functional modules of a warehousing apparatus functional module, in accordance with some embodiment.

FIG. 6 is a block diagram of various functional modules of a warehousing apparatus functional module 602, in accordance with some embodiments. The warehousing apparatus functional module 602 may be part of a warehousing apparatus that includes at least one robotic arm. The warehousing apparatus functional module 602 may include a processor 604. In further embodiments, the processor 604 may be implemented as one or more processors.

The processor 604 may be operatively connected to a computer readable storage module 606 (e.g., a memory and/or data store), a network connection module 608, a user interface module 610, and a controller module 612. In some embodiments, the computer readable storage module 606 may include warehousing apparatus process logic that may configure the processor 604 to perform the various processes discussed herein. The computer readable storage may also store data, such as identifiers for a die, identifiers for a die vessel, identifiers for a die vessel container, and any other parameter or information that may be utilized to perform the various processes discussed herein.

The network connection module 608 may facilitate a network connection of the warehousing apparatus with various devices and/or components of the workstation that may communicate within or external to the warehousing apparatus functional module 602. In certain embodiments, the network connection module 608 may facilitate a physical connection, such as a line or a bus. In other embodiments, the network connection module 608 may facilitate a wireless connection, such as over a wireless local area network (WLAN) by using a transmitter, receiver, and/or transceiver. For example, the network connection module 608 may facilitate a wireless or wired connection with various robotic arms, the processor 604 and the controller module 612.

The warehousing apparatus functional module 602 may also include the user interface module 610. The user interface module 610 may include any type of interface for input and/or output to an operator of the warehousing apparatus, including, but not limited to, a monitor, a laptop computer, a tablet, or a mobile device, etc.

The warehousing apparatus functional module 602 may include a controller module 612. In certain embodiments, the controller module 612 may be implemented by (e.g., be part of) the processor 604. The controller module 612 may be configured to control various physical apparatuses that control movement or functionality of the warehousing apparatus, at least one robotic arm, and/or the actuator system. For example, the controller module 612 may be configured to control movement or functionality for a robotic arm and the like. As a more specific example, the controller module 612 may control a motor that may move a robotic arm. The controller may be controlled by the processor and may carry out the various aspects of the various processes discussed herein.

Figure 7A:
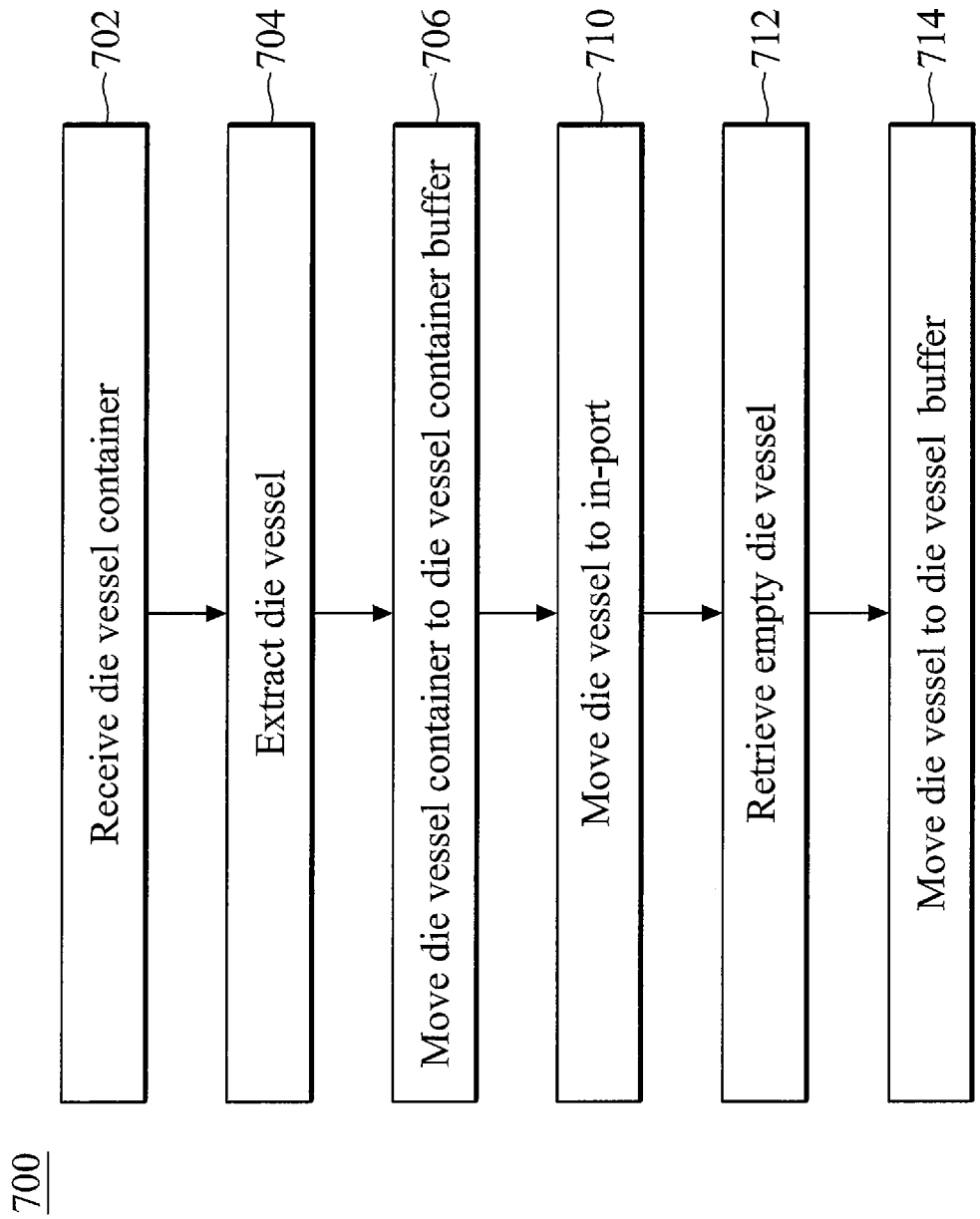
FIG. 7A is a flowchart of a warehousing buffering process, in accordance with some embodiments.

FIG. 7A is a flowchart of a warehousing buffering process 700, in accordance with some embodiments. The warehousing buffering process may be performed by a warehousing apparatus, as introduced above. It is noted that the process 700 is merely an example, and is not intended to limit the present disclosure. Accordingly, it is understood that additional operations may be provided before, during, and after the process 700 of FIG. 7A, certain operations may be omitted, certain operations may be performed concurrently with other operations, and that some other operations may only be briefly described herein.

At operation 702, the warehousing apparatus may receive a die vessel container. This die vessel container may include at least one die vessel. Unprocessed dies (e.g., dies not yet processed by a semiconductor die processing tool that the warehousing apparatus is interfaced with) may be collected on the die vessel. The die vessel may include multiple receptacles configured to receive each die on the die vessel. The receptacles may be flanked by at least one pin, which may be moved over the die to secure the die to the die vessel. Optionally, a die vessel may not include a pin in certain embodiments. In particular embodiments, the die vessel may be made from various materials that have different degrees of malleability from heat application, such as a metal or a plastic.

In particular embodiments, the unprocessed dies, as part of a die vessel, may be received at the warehousing apparatus from an external system. The external system may be, for example, an automated material handling system, a rail and vehicle system or a system that includes automatic guided vehicles (AGVs), personal guided vehicles (PGVs), rail guided vehicles (RGVs), overhead shuttles (OHSs), and overhead hoist transports (OHTs). The unprocessed dies may be transferred to and/or from the external system via a robotic arm (e.g., movement via an automated material handling system robotic arm or a warehousing apparatus robotic arm). In other embodiments, the unprocessed dies may be placed manually on the warehousing apparatus (e.g., at a port of entry for the warehousing apparatus) by an operator or technician of the warehousing apparatus.

As noted above, the die vessel may be located within the die vessel container. Accordingly, the die vessel may be considered as a discrete and/or removable part of a die vessel container. The die vessel container may be either a slotted die vessel container or a stackable die vessel container. The slotted die vessel container may include various slots from which die vessels may be secured, inserted, or removed. When within a slotted die vessel container, the die vessels may be located at a set predetermined vertical distance from each other, as determined by the slots in the slotted die vessel container. In contrast, die vessels may be stacked with one on top of another in a stackable die vessel container. In certain embodiments, a die vessel container may be also referred to as a magazine or a tray cassette. Also, the die vessel container may be made of either a metal or a plastic. In particular embodiments, the slotted die vessel container may be made of a metal while the stackable die vessel container may be made of a plastic.

At operation 704, a die vessel may be extracted from the received die vessel container. For example, the die vessel may be part of a stack of die vessels extracted from a stackable die vessel container or may be a single die vessel extracted from a slotted die vessel container. The extraction of the die vessel from the die vessel container may be performed at a conversion station. In certain embodiments, the conversion station may be on top of the semiconductor die processing tool or may be on a shelf connected to the semiconductor die processing tool similar to a die vessel buffer or a die vessel container buffer. As noted above, the conversion station may include various structures (e.g., a die vessel container holding structure and a die vessel holding structure) configured to extract a die vessel from a die vessel container. Additionally, the warehousing apparatus may include a robotic arm with an end effector configured to manipulate (e.g., hold and move) the die vessel during and after extraction from the die vessel container. This end effector may include any end effector capable of grasping and handling the die vessel, such as a die vessel stack robotic arm end effector or other end effector discussed above.

At operation 706, the empty die vessel container may be moved to a die vessel container buffer. As noted above, the die vessel may be extracted from the die vessel container. Then, when empty, the empty die vessel container may be moved from the conversion station to a die vessel container buffer. The movement may be facilitated by a robotic arm of the warehousing apparatus. In certain embodiments, the die vessel container buffer may be on top of the semiconductor die processing tool or may be on a shelf connected to the semiconductor die processing tool.

At operation 710, the die vessel extracted from the die vessel container may be moved to an in-port. This in-port may be a loaded die vessel in-port configured to receive loaded die vessels (e.g., die vessels with semiconductor dies that are not yet processed by the semiconductor die processing tool or that are to be reprocessed by the semiconductor die processing tool). Although operation 706 is illustrated as preceding operation 710, as indicated above, it is noted that the process 700 is merely an example, and is not intended to limit the present disclosure. Accordingly, it is understood that operation 710 may precede operation 706 in certain embodiments or may be performed in parallel with operation 710 in other embodiments.

At operation 712, the empty die vessel may be retrieved. This empty die vessel may be retrieved from the in-port after the semiconductor die processing tool has ingested the dies from the die vessel. For example, as noted above, the in-port may include a loaded die vessel in-port and an empty die vessel in-port. The empty die vessel in-port may be where the die vessels are located (e.g., placed or put) by the semiconductor die processing tool after the constituent dies of the die vessel are ingested for processing by the semiconductor die processing tool.

At operation 714, the empty die vessel may be moved to a die vessel buffer. As noted above, the empty die vessel may be located at the empty die vessel in-port after the constituent dies are ingested at the loaded die vessel in-port. Then, the empty die vessel may be moved from the loaded die vessel in-port to a die vessel buffer. The movement may be facilitated by a robotic arm of the warehousing apparatus. In certain embodiments, the die vessel buffer may be on top of the semiconductor die processing tool or may be on a shelf connected to the semiconductor die processing tool.

Figure 7B:
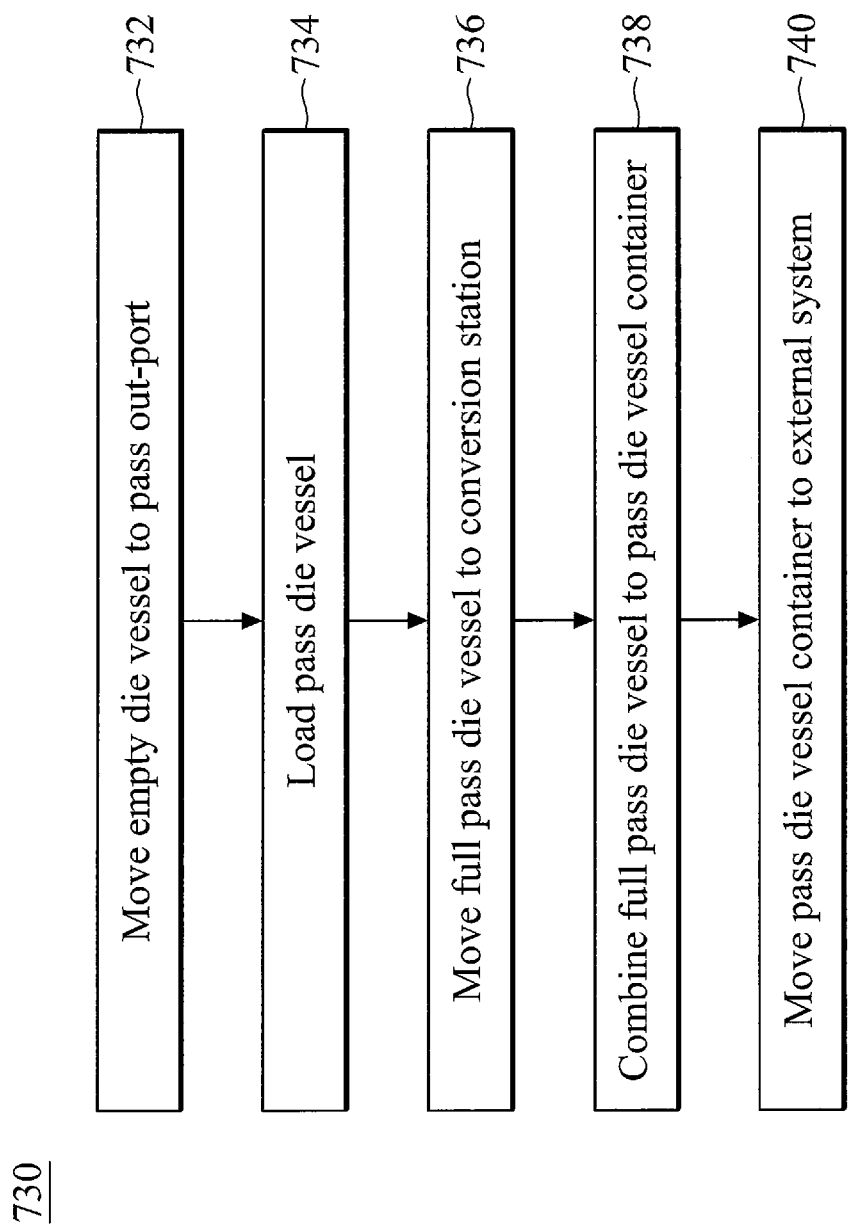
FIG. 7B is a flowchart of a pass out-port process, in accordance with some embodiments.

FIG. 7B is a flowchart of a pass out-port process 730, in accordance with some embodiments. The pass out-port process may be performed by a warehousing apparatus, as introduced above. It is noted that the process 730 is merely an example, and is not intended to limit the present disclosure. Accordingly, it is understood that additional operations may be provided before, during, and after the process 730 of FIG. 7B, certain operations may be omitted, certain operations may be performed concurrently with other operations, and that some other operations may only be briefly described herein.

At operation 732, an empty die vessel may be moved from a die vessel buffer to a pass out-port. As noted above, a warehousing apparatus may include a die vessel buffer to store empty die vessels (e.g., die vessels without constituent semiconductor dies). In certain embodiments, these empty die vessels may be die vessels whose dies have already been ingested for processing by a semiconductor die processing tool and moved to the die vessel buffer from an empty die vessel in-port. These empty die vessels at the die vessel buffer may then be brought by the warehousing apparatus to the pass out-port of the semiconductor die processing tool. In particular embodiments, the semiconductor die processing tool may detect (e.g., using a sensor) and communicate (e.g., indicate over a network connection or communication interface) that there is no die vessel at the pass out-port. This may trigger the warehousing apparatus to bring an empty die vessel to the pass out-port to receive semiconductor dies.

In certain embodiments, an out-port of the semiconductor die processing tool may have, as sub-ports, a pass out-port, a fail out-port, and a reprocess out-port. The pass out-port may be a location at the semiconductor die processing tool in which processed semiconductor dies that meet or exceed a processing standard (e.g., that are without defects or that are without defects detected by the semiconductor die processing tool) may be deposited. In certain embodiments, the pass out-port may require a die vessel to receive the individually processed semiconductor dies that meet or exceed the processing standard. Thus, an empty die vessel may be brought by the warehousing apparatus to the pass out-port to receive the processed semiconductor dies at the pass out-port.

At operation 734, the die vessel at the pass out-port may be loaded with semiconductor dies at the pass out-port. The die vessel at the pass out-port may be loaded with semiconductor dies at the pass out-port until the die vessel at the pass out-port is fully loaded (e.g., is full, or when the die vessel is a full pass die vessel).

At operation 736, the full pass die vessel may be moved to a conversion station. In particular embodiments, as noted above, a warehousing apparatus may include a die vessel container buffer to store empty die vessel containers (e.g., die vessel containers without constituent die vessels). In certain embodiments, these empty die vessel containers may be die vessel containers whose die vessels have already been removed at the conversion station for processing by a semiconductor die processing tool. These empty die vessel containers may have been moved to the die vessel container buffer from the conversion station. These empty die vessel containers at the die vessel buffer may then be brought by the warehousing apparatus back to the conversion station, as needed, to be filled with constituent die vessels (e.g., full pass die vessels).

At operation 738, the full pass die vessel may be inserted into (e.g., combined with) a die vessel container at the conversion station. As noted above, a die vessel container may be a stackable die vessel container or a slotted die vessel container. Accordingly, the die vessel may be part of a stack of die vessels for insertion into a stackable die vessel container or may be a single die vessel for insertion into a slotted die vessel container. The insertion of the die vessel into the die vessel container may be performed at the conversion station. In certain embodiments, the conversion station may be on top of the semiconductor die processing tool or may be on a shelf connected to the semiconductor die processing tool similar to a die vessel buffer or a die vessel container buffer. As noted above, the conversion station may include various structures (e.g., a die vessel container holding structure and a die vessel holding structure) configured to insert a die vessel into a die vessel container. Additionally, the warehousing apparatus may include a robotic arm with an end effector configured to manipulate (e.g., hold and move) the die vessel during and after insertion into the die vessel container. This end effector may include any end effector capable of grasping and handling the die vessel, such as a die vessel stack robotic arm end effector or other end effector discussed above. In certain embodiments, the fully loaded die vessel may be loaded with other fully loaded die vessels into the die vessel container.

At operation 740, the die vessel container, sufficiently full with full pass die vessels, may be moved to an external system. In certain embodiments, being sufficiently full may refer to the die vessel container including a desired number (e.g., up to a maximum capacity number) of die vessels (e.g., full pass die vessels). Then, once the die vessel container is fully loaded with die vessels, the fully loaded die vessel container may be transported by the warehousing apparatus to an external system for further processing.

In certain embodiments, the external system may be, for example, an automated material handling system, a rail and vehicle system or a system that includes automatic guided vehicles (AGVs), personal guided vehicles (PGVs), rail guided vehicles (RGVs), overhead shuttles (OHSs), and overhead hoist transports (OHTs). The die vessel container may be transferred to and/or from the external system via a manipulation of the automated material handling system (e.g., movement via an automated material handling system robotic arm). In other embodiments, the die vessel container may be removed manually from the warehousing apparatus (e.g., at a port of exit for the warehousing apparatus) by an operator or technician of the warehousing apparatus.

Figure 7C:
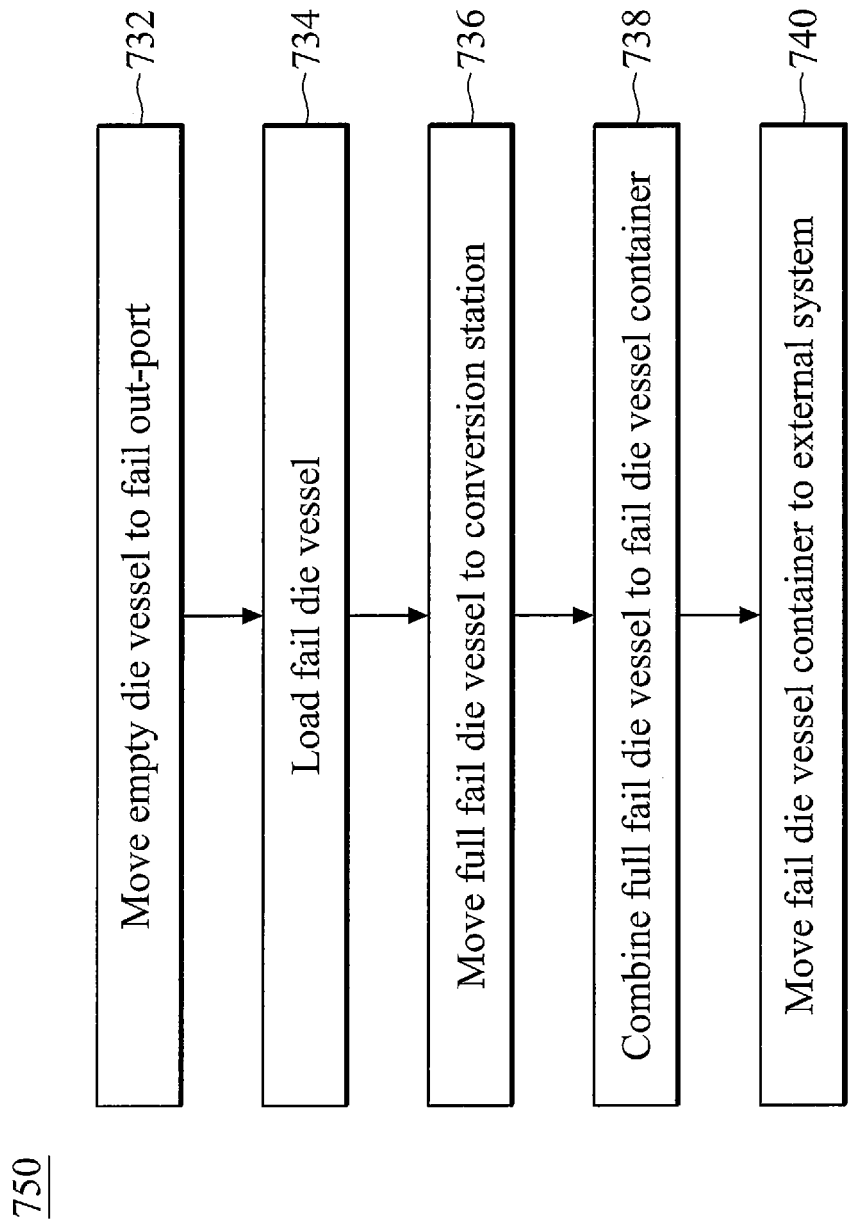
FIG. 7C is a flowchart of a fail out-port process, in accordance with some embodiments.

FIG. 7C is a flowchart of a fail out-port process 750, in accordance with some embodiments. The fail out-port process may be performed by a warehousing apparatus, as introduced above. It is noted that the process 750 is merely an example, and is not intended to limit the present disclosure. Accordingly, it is understood that additional operations may be provided before, during, and after the process 750 of FIG. 7C, certain operations may be omitted, certain operations may be performed concurrently with other operations, and that some other operations may only be briefly described herein.

At operation 752, an empty die vessel may be moved from a die vessel buffer to a fail out-port. As noted above, a warehousing apparatus may include a die vessel buffer to store empty die vessels (e.g., die vessels without constituent semiconductor dies). In certain embodiments, these empty die vessels may be die vessels whose dies have already been ingested for processing by a semiconductor die processing tool and moved to the die vessel buffer from an empty die vessel in-port. These empty die vessels at the die vessel buffer may then be brought by the warehousing apparatus to the fail out-port of the semiconductor die processing tool. In particular embodiments, the semiconductor die processing tool may detect (e.g., using a sensor) and communicate (e.g., indicate over a network connection or communication interface) that there is no die vessel at the fail out-port. This may trigger the warehousing apparatus to bring an empty die vessel to the fail out-port to receive semiconductor dies.

In certain embodiments, an out-port of the semiconductor die processing tool may have, as sub-ports, a pass out-port, the fail out-port, and a reprocess out-port. The fail out-port may be a location at the semiconductor die processing tool in which processed semiconductor dies that do not meet or exceed a processing standard (e.g., that are with defects or that are with defects detected by the semiconductor die processing tool) may be deposited. In certain embodiments, the fail out-port may require a die vessel to receive the individually processed semiconductor dies that do not meet or exceed the processing standard. Thus, an empty die vessel may be brought by the warehousing apparatus to the fail out-port to receive the processed semiconductor dies at the fail out-port.

At operation 754, the die vessel at the fail out-port may be loaded with semiconductor dies at the fail out-port. The die vessel at the fail out-port may be loaded with semiconductor dies at the fail out-port until the die vessel at the fail out-port is fully loaded (e.g., is full, or when the die vessel is a full fail die vessel).

At operation 756, the full fail die vessel may be moved to a conversion station. In particular embodiments, as noted above, a warehousing apparatus may include a die vessel container buffer to store empty die vessel containers (e.g., die vessel containers without constituent die vessels). In certain embodiments, these empty die vessel containers may be die vessel containers whose die vessels have already been removed at the conversion station for processing by a semiconductor die processing tool. These empty die vessel containers may have been moved to the die vessel container buffer from the conversion station. These empty die vessel containers at the die vessel buffer may then be brought by the warehousing apparatus back to the conversion station, as needed, to be filled with constituent die vessels (e.g., full fail die vessels).

At operation 758, the full fail die vessel may be inserted into (e.g., combined with) a die vessel container at the conversion station. As noted above, a die vessel container may be a stackable die vessel container or a slotted die vessel container. Accordingly, the die vessel may be part of a stack of die vessels for insertion into a stackable die vessel container or may be a single die vessel for insertion into a slotted die vessel container. The insertion of the die vessel into the die vessel container may be performed at the conversion station. In certain embodiments, the conversion station may be on top of the semiconductor die processing tool or may be on a shelf connected to the semiconductor die processing tool similar to a die vessel buffer or a die vessel container buffer. As noted above, the conversion station may include various structures (e.g., a die vessel container holding structure and a die vessel holding structure) configured to insert a die vessel into a die vessel container. Additionally, the warehousing apparatus may include a robotic arm with an end effector configured to manipulate (e.g., hold and move) the die vessel during and after insertion into the die vessel container. This end effector may include any end effector capable of grasping and handling the die vessel, such as a die vessel stack robotic arm end effector or other end effector as discussed above. In certain embodiments, the fully loaded die vessel may be loaded with other fully loaded die vessels into the die vessel container.

At operation 760, the die vessel container sufficiently full with full fail die vessels may be moved to an external system. In certain embodiments, being sufficiently full may refer to the die vessel container including a desired number (e.g., up to a maximum capacity number) of die vessels (e.g., full fail die vessels). Then, once the die vessel container is fully loaded with die vessels, the fully loaded die vessel container may be transported by the warehousing apparatus to an external system for further processing.

In certain embodiments, the external system may be, for example, an automated material handling system, a rail and vehicle system or a system that includes automatic guided vehicles (AGVs), personal guided vehicles (PGVs), rail guided vehicles (RGVs), overhead shuttles (OHSs), and overhead hoist transports (OHTs). The die vessel container may be transferred to and/or from the external system via a manipulation of the automated material handling system (e.g., movement via an automated material handling system robotic arm). In other embodiments, the die vessel container may be removed manually from the warehousing apparatus (e.g., at a port of exit for the warehousing apparatus) by an operator or technician of the warehousing apparatus.

Figure 7D:
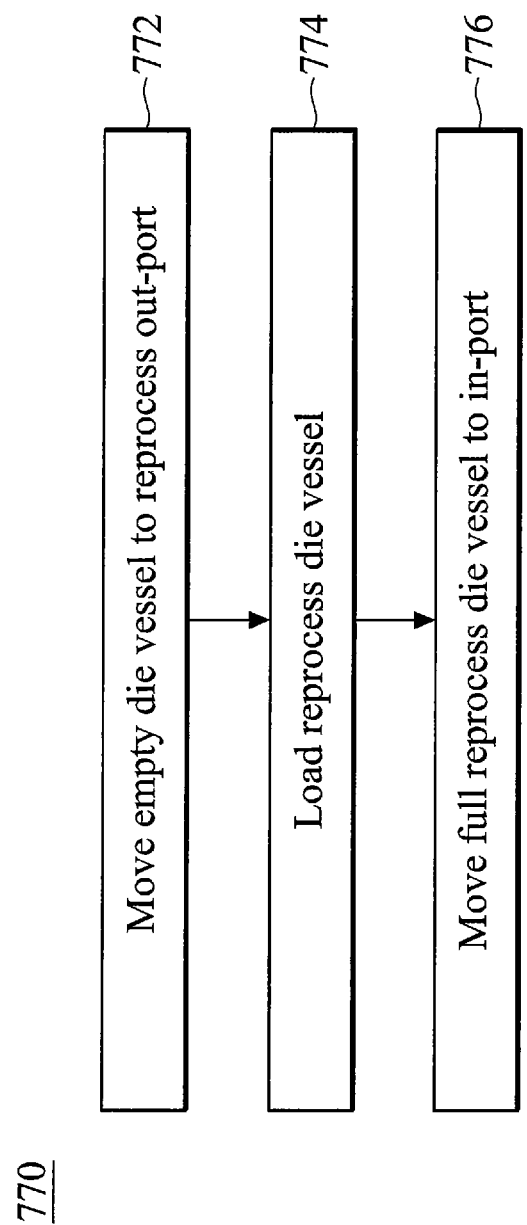
FIG. 7D is a flowchart of a reprocess out-port process, in accordance with some embodiments.

FIG. 7D is a flowchart of a reprocess out-port process 770, in accordance with some embodiments. The reprocess out-port process may be performed by a warehousing apparatus, as introduced above. It is noted that the process 770 is merely an example, and is not intended to limit the present disclosure. Accordingly, it is understood that additional operations may be provided before, during, and after the process 770 of FIG. 7D, certain operations may be omitted, certain operations may be performed concurrently with other operations, and that some other operations may only be briefly described herein.

At operation 772, an empty die vessel may be moved from a die vessel buffer to a reprocess out-port. As noted above, a warehousing apparatus may include a die vessel buffer to store empty die vessels (e.g., die vessels without constituent semiconductor dies). In certain embodiments, these empty die vessels may be die vessels whose dies have already been ingested for processing by a semiconductor die processing tool and moved to the die vessel buffer from an empty die vessel in-port. These empty die vessels at the die vessel buffer may then be brought by the warehousing apparatus to the reprocess out-port of the semiconductor die processing tool. In particular embodiments, the semiconductor die processing tool may detect (e.g., using a sensor) and communicate (e.g., indicate over a network connection or communication interface) that there is no die vessel at the reprocess out-port. This may trigger the warehousing apparatus to bring an empty die vessel to the reprocess out-port to receive semiconductor dies.

In certain embodiments, an out-port of the semiconductor die processing tool may have, as sub-ports, a pass out-port, a fail out-port, and the reprocess out-port. In certain embodiments, the reprocess out-port may be a location at the semiconductor die processing tool in which processed semiconductor dies that need to be reprocessed to determine whether they meet or exceed a processing standard (e.g., that are with defects or that are with defects detected by the semiconductor die processing tool) may be deposited. In certain embodiments, the reprocess out-port may require a die vessel to receive the individually processed semiconductor dies for reprocessing (e.g., that need to be reprocessed by being brought back again to the loaded die vessel in-port to be reprocessed by the semiconductor die processing tool). Thus, an empty die vessel may be brought by the warehousing apparatus to the reprocess out-port to receive the processed semiconductor dies at the reprocess out-port.

At operation 774, the die vessel at the reprocess out-port may be loaded with semiconductor dies at the reprocess out-port. The die vessel at the reprocess out-port may be loaded with semiconductor dies at the reprocess out-port until the die vessel at the reprocess out-port is fully loaded (e.g., is full, or when the die vessel is a full reprocess die vessel).

At operation 776, the full reprocess die vessel may be moved to a loaded die vessel in-port for reprocessing (e.g., to be processed by the semiconductor die processing tool again). The loaded die vessel in-port may be an in-port to the semiconductor die processing tool in which a die vessel with dies that are to be processed by the semiconductor die processing tool may be received by the semiconductor die processing tool. The entire die vessel may be ingested by the semiconductor die processing tool with the individual constituent dies of the die vessel taken by the semiconductor die processing tool for processing, as noted above.

In an embodiment, a system includes: a warehousing apparatus configured to interface with a semiconductor die processing tool configured to process a semiconductor die singulated from a wafer, wherein the semiconductor die processing tool comprise an in-port and an out-port, wherein the warehousing apparatus is configured to: move a first die vessel that contains the semiconductor die to the in-port from a first die vessel container, wherein the first die vessel container is configured to house the first die vessel; move the first die vessel from the in-port to a buffer region; and move a second die vessel from the buffer region to the out-port.

In another embodiment, a system includes: a semiconductor die processing tool configured to process a semiconductor die singulated from a wafer, wherein the semiconductor die processing tool comprise an in-port and an out-port; a warehousing apparatus configured to: move a first die vessel that contains the semiconductor die to the in-port from a first die vessel container; move the first die vessel from the in-port to a buffer region on top of the semiconductor die processing tool; move a second die vessel from the buffer region to the out-port; and move the second die vessel from the out-port to a second die vessel container.

In another embodiment, a method includes: moving, via a warehousing apparatus, a first die vessel that contains a semiconductor die singulated from a wafer to an in-port from a first die vessel container, wherein the first die vessel container is configured to house the first die vessel, and wherein the warehousing apparatus is configured to interface with a semiconductor die processing tool configured that processes the semiconductor die; moving, via the warehousing apparatus, the first die vessel from the in-port to a buffer region; and moving, via the warehousing apparatus, a second die vessel from the buffer region to an out-port.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
 a processing tool configured to process one or more semiconductor dies;
 an in-port configured to receive a loaded die vessel containing a plurality of semiconductor dies, wherein the in-port comprises a loaded die vessel in-port and an empty die vessel in-port, wherein the loaded die vessel in-port is configured to receive the loaded die vessel containing a plurality of dies to be processed by the processing tool, and wherein the empty die-vessel in-port is configured to receive a resulting empty die vessel after the plurality of dies are removed from the loaded die vessel to be processed by the processing tool;
 an out-port configured to receive an empty die vessel for storing dies processed by the processing tool;
 a buffer region; and
 a robotic arm configured to remove a first plurality of die vessels stacked in a first die vessel container, wherein the robotic arm is further configured to:
  move the loaded die vessel to the loaded die vessel in-port from the first die vessel container, wherein the first die vessel container is configured to house the first plurality of die vessels;
  move the resulting empty die vessel from the empty die vessel in-port to the buffer region;
  move the resulting empty die vessel from the buffer region to the out-port,
 wherein the robotic arm comprises an end effector configured to secure a stack of die vessels, the end effector comprising:
  a first surface configured slide under a bottom wall of a lowest die vessel of the stack of die vessels; and
  a pair of side gates configured to laterally support the stack of die vessels so as to prevent individual die vessels from sliding off the stack of die vessels during transit.

2. The system of claim 1, wherein the out-port comprises a pass out-port, a fail out-port, and a reprocess out-port, wherein the robotic arm is configured to move the resulting empty die vessel from the buffer region to one of the pass out-port, the fail out-port, and the reprocess out-port.

3. The system of claim 1, wherein the robotic arm is configured to move a second die vessel from the out-port to a second die vessel container.

4. The system of claim 3, wherein the first die vessel container and the second die vessel container are a same die vessel container.

5. The system of claim 3, wherein the first die vessel container and the second die vessel container are different die vessel containers.

6. The system of claim 3, wherein the external system comprises a vehicle that moves the second die vessel container from the semiconductor die processing tool to another semiconductor die processing tool in response to determining that the second die vessel container is full.

7. The system of claim 1, wherein the robotic arm is configured to move the second die vessel to the in-port in response to an indication from the semiconductor die processing tool that the semiconductor die is to be reprocessed.

8. The system of claim 1, wherein the robotic arm is further configured to:
load the dies processed by the processing tool into the resulting empty die vessel to convert the empty die vessel into a fully loaded die vessel; and
load the fully loaded die vessel into a second die vessel container; and
when the second die vessel container is fully loaded with the second plurality of die vessels, transport the second die vessel container to an external system.

9. A system, comprising:
a semiconductor die processing tool configured to process a semiconductor die singulated from a wafer, wherein the semiconductor die processing tool comprises an in-port and an out-port,
wherein the in-port comprises a loaded die vessel in-port and an empty die vessel in-port, wherein the loaded die vessel in-port is configured to receive the loaded die vessel containing a plurality of dies to be processed by the processing tool, and wherein the empty die-vessel in-port is configured to receive a resulting empty die vessel after the plurality of dies are removed from the loaded die vessel to be processed by the processing tool, and
wherein the out-port is configured to receive an empty die vessel for storing dies processed by the processing tool;
a buffer region on top of the semiconductor processing tool; and
a conversion station comprising a robotic arm configured to remove a first plurality of die vessels stacked in a first die vessel container and insert a second plurality of die vessels into a second die vessel container in a stacked configuration, wherein the robotic arm is further configured to:
move the loaded die vessel to the loaded die vessel in-port from the first die vessel container;
move the resulting empty die vessel from the empty die vessel in-port to the buffer region on top of the semiconductor die processing tool;
move the resulting empty die vessel from the buffer region to the out-port;
load the dies processed by the processing tool into the resulting empty die vessel to convert the empty die vessel into a fully loaded die vessel;
load the fully loaded die vessel into the second die vessel container; and
when the second die vessel container is fully loaded with the second plurality of die vessels, transport the second die vessel container to an external system,
wherein the robotic arm comprises an end effector configured to secure a stack of die vessels, the end effector comprising:
a first surface configured slide under a bottom wall of a lowest die vessel of the stack of die vessels; and
a pair of side gates configured to laterally support the stack of die vessels so as to prevent individual die vessels from sliding off the stack of die vessels during transit.

10. The system of claim 9, wherein the robotic arm is configured to move the resulting empty die vessel from the buffer region to the out-port in response to an indication of process completion from the semiconductor die processing tool.

11. The system of claim 9, wherein the buffer region is configured to receive and store a plurality of die vessels.

12. The system of claim 9, wherein the robotic arm is configured to interface with an overhead warehousing apparatus.

13. The system of claim 12, wherein the in-port and the out-port is within a work envelope of the robotic arm.

14. The system of claim 9, wherein the first die vessel and the second die vessel are a same die vessel.

15. The system of claim 9, wherein the first die vessel and the second die vessel are different die vessels.

16. A method, comprising:
removing a first die vessel from a first die vessel container containing a first plurality of die vessels in a stacked configuration, wherein the removing comprises:
simultaneously securing the stack of first plurality of die vessels by sliding a first surface of an end effector of the robotic arm under a bottom wall of a lowest die vessel of the stack of the first plurality of die vessels; and
laterally supporting the stack of the first plurality of die vessels with a pair of side gates of the end effector configured to prevent individual die vessels from sliding off the stack during transit;
moving the first die vessel from the stack of the first plurality of die vessels, wherein the first die vessel contains a semiconductor die singulated from a wafer, to an in-port from the first die vessel container, wherein the first die vessel container is configured to house the first die vessel among the first plurality of die vessels;
removing the semiconductor die from the loaded die vessel to be processed by a semiconductor die processing tool, thereby converting the loaded die vessel to an empty die vessel;
moving the empty die vessel from the in-port to a buffer region;
moving the empty die vessel from the buffer region to an out-port;
loading the semiconductor die processed by the processing tool into the resulting empty die vessel to convert the empty die vessel into a fully loaded die vessel;
loading the fully loaded die vessel into a second die vessel container; and
when the second die vessel container is fully loaded with a second plurality of die vessels, transporting the second die vessel container to an external system.

17. The method of claim 16, further comprising:
moving the fully loaded die vessel from the out-port into the second die vessel container configured to store the second plurality of die vessels.

18. The method of claim 17, further comprising:
moving the first die vessel container to a die vessel container buffer.

19. The method of claim 17, wherein the first die vessel container and the second die vessel container are a same die vessel container.

20. The method of claim 17, further comprising:
moving the second die vessel from the buffer region to the out-port in response to an indication of process completion from the semiconductor die processing tool.

* * * * *